(12) United States Patent
Kobayashi

(10) Patent No.: US 11,561,114 B2
(45) Date of Patent: Jan. 24, 2023

(54) PRESSURE-SENSITIVE TOUCH SENSOR AND PRESSURE-SENSITIVE TOUCH SENSOR MODULE

(71) Applicant: Shin-Etsu Polymer Co., Ltd., Tokyo (JP)

(72) Inventor: Yusuke Kobayashi, Shiojiri (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 142 days.

(21) Appl. No.: 17/058,655

(22) PCT Filed: May 27, 2019

(86) PCT No.: PCT/JP2019/020846
§ 371 (c)(1),
(2) Date: Nov. 25, 2020

(87) PCT Pub. No.: WO2019/230634
PCT Pub. Date: Dec. 5, 2019

(65) Prior Publication Data
US 2021/0199472 A1 Jul. 1, 2021

(30) Foreign Application Priority Data
May 29, 2018 (JP) .............................. JP2018-102735

(51) Int. Cl.
*G01D 5/241* (2006.01)
*H03K 17/96* (2006.01)

(52) U.S. Cl.
CPC ......... *G01D 5/2417* (2013.01); *H03K 17/962* (2013.01); *H03K 2217/960755* (2013.01)

(58) Field of Classification Search
CPC ........ G01R 27/00; G01R 27/02; G01R 27/26; G01R 27/2605; G01D 5/00; G01D 5/12;
(Continued)

(56) References Cited

U.S. PATENT DOCUMENTS

| 6,894,507 B2 * | 5/2005 | Morimoto .......... G01R 27/2605 324/660 |
| 10,488,970 B2 * | 11/2019 | Yoon ..................... G06F 3/0446 |
| 2010/0230181 A1 * | 9/2010 | Suzuki ................. H03K 17/962 178/18.06 |

FOREIGN PATENT DOCUMENTS

| JP | 2010217967 A | 9/2010 |
| JP | 201358553 A | 3/2013 |

(Continued)

OTHER PUBLICATIONS

International Search Report in PCT Application No. PCT/JP2019/020846, dated Aug. 6, 2019, 4pp.

*Primary Examiner* — Hoai-An D. Nguyen

(74) *Attorney, Agent, or Firm* — Hauptman Ham, LLP

(57) ABSTRACT

In a pressure-sensitive touch sensor of a capacitance type, a first electrode and a second electrode are provided on a first surface of a base material sheet. The base material sheet is folded between the first electrode and the second electrode so that a surface of the first electrode and a surface of the second electrode face each other. The base material sheet is folded at a fold line portion in which a slit is formed. An elastic layer is provided between folded parts of the base material sheet. The pressure-sensitive touch sensor is configured to detect pressing on the operation surface based on a change in capacitance, which is caused when the elastic layer is compressed and deformed in a thickness direction by a pressing force to reduce a distance between the first electrode and the second electrode.

7 Claims, 14 Drawing Sheets

(58) Field of Classification Search
CPC ............ G01D 5/14; G01D 5/24; G01D 5/241; G01D 5/2417; G06F 3/00; G06F 3/01; G06F 3/03; G06F 3/041; G06F 3/044; G06F 3/0447; H03K 17/00; H03K 17/94; H03K 17/96; H03K 17/962; H03K 17/9622; H03K 17/965; H03K 17/975; H03K 17/98; H03K 2217/00; H03K 2217/94; H03K 2217/96; H03K 2217/9607; H03K 2217/960755; H01H 36/00

See application file for complete search history.

(56) References Cited

FOREIGN PATENT DOCUMENTS

| | | |
|---|---|---|
| JP | 201579328 A | 4/2015 |
| KR | 1020180053375 A | 5/2018 |

* cited by examiner

PRESSURE-SENSITIVE TOUCH SENSOR AND PRESSURE-SENSITIVE TOUCH SENSOR MODULE

RELATED APPLICATIONS

The present application is a National Phase of International Application No. PCT/JP2019/020846, filed May 27, 2019, and claims priority based on Japanese Patent Application No. 2018-102735, filed May 29, 2018.

TECHNICAL FIELD

This disclosure relates to a pressure-sensitive touch sensor and a pressure-sensitive touch sensor module.

This application claims priority from Japanese Patent Application No. 2018-102735, filed on May 29, 2018, the contents of which are incorporated herein by reference in their entirety.

BACKGROUND ART

In a field of in-vehicle electronic equipment or other various fields, as a sensor module configured to detect an operation performed on an operation surface, there has been proposed a pressure-sensitive touch sensor module of a capacitance type that allows pressure-sensitive detection. For example, in Patent Literature 1, there is disclosed a pressure-sensitive touch sensor module including a first electrode and a second electrode that are provided on one surface of a base material sheet. The base material sheet is partially folded so that the first electrode and the second electrode are caused to face each other. The pressure-sensitive touch sensor module further includes an elastic sheet provided between the first electrode and the second electrode. In the pressure-sensitive touch sensor module, when the operation surface is pressed, the elastic sheet is compressed and deformed to cause the first electrode and the second electrode to approach each other. A current of the second electrode accordingly changes to change a capacitance. When the change in capacitance is detected, the pressing on the operation surface can be recognized.

CITATION LIST

Patent Literature

[PTL 1] JP 2010-217967 A

SUMMARY OF INVENTION

Technical Problem

However, in the pressure-sensitive touch sensor module as in Patent Literature 1, a touch onto the operation surface may be erroneously detected, and thus the operation may be incorrectly recognized.

This disclosure has an object to provide a pressure-sensitive touch sensor of a capacitance type, with which a touch onto an operation surface is less liable to be erroneously detected, and a pressure-sensitive touch sensor module including the pressure-sensitive touch sensor.

Solution to Problem

This disclosure has the following structure.

[1] A pressure-sensitive touch sensor of a capacitance type, which is configured to detect pressing on an operation surface, includes: a base material sheet; a first electrode; a second electrode; and an elastic layer. The first electrode and the second electrode are each provided on any surface of the base material sheet. The base material sheet is folded between the first electrode and the second electrode so that a surface of the first electrode and a surface of the second electrode face each other. The base material sheet is folded at a fold line portion in which a slit is formed. The elastic layer is provided between folded parts of the base material sheet. The pressing on the operation surface is detected based on a change in capacitance, which is caused when the elastic layer is compressed and deformed in a thickness direction by a pressing force to reduce a distance between the first electrode and the second electrode.

[1] In the pressure-sensitive touch sensor described in item [1], the slit is formed at least between the first electrode and the second electrode in the base material sheet.

[3] In the pressure-sensitive touch sensor described in item [1] or item [2], the elastic layer is positioned between the first electrode and the second electrode.

[4] In the pressure-sensitive touch sensor described in any one of items [1] to [3], the elastic layer is a rubber-like elastic body including: a pair of sheet portions; and a column portion sandwiched between the pair of sheet portions.

[5] In the pressure-sensitive touch sensor described in any one of items [1] to [4], the elastic layer is a rubber-like elastic body including: a pair of sheet portions; a plurality of column portions sandwiched between the pair of sheet portions; and a frame-shaped portion provided to surround the plurality of column portions.

[6] In the pressure-sensitive touch sensor described in any one of items [1] to [5], the elastic layer is a rubber-like elastic body including: a pair of sheet portions; a plurality of column portions sandwiched between the pair of sheet portions; and a projecting portion or a protruding portion, which is sandwiched between the pair of sheet portions, and has a height smaller than a height of each of the plurality of column portions.

[7] In the pressure-sensitive touch sensor described in any one of items [1] to [5], the elastic layer is a rubber-like elastic body including: a pair of sheet portions; a plurality of column portions sandwiched between the pair of sheet portions; and projecting portions, which are sandwiched between the pair of sheet portions, and are provided in a lattice pattern so as to individually surround the plurality of column portions.

[8] The pressure-sensitive touch sensor described in any one of items [1] to [7] further includes a third electrode provided on a first surface of the base material sheet. The pressure-sensitive touch sensor is configured to detect a contact of a conductor onto the operation surface based on a change in capacitance of the third electrode, which is caused when the conductor is brought into contact with the operation surface.

[9] A pressure-sensitive touch sensor module includes: an operation panel having an operation surface; a frame member; and the pressure-sensitive touch sensor of any one of items [1] to [8]. The pressure-sensitive touch sensor is sandwiched between the operation panel and the frame member.

[10] In the pressure-sensitive touch sensor module described in item [9], the frame member includes a protrusion, and a part of the pressure-sensitive touch sensor at which the elastic layer is positioned is sandwiched between the operation panel and the protrusion.

Advantageous Effects of Invention

According to this disclosure, the pressure-sensitive touch sensor of the capacitance type and the pressure-sensitive touch sensor module, with which the touch onto the operation surface is less liable to be erroneously detected, can be provided.

DESCRIPTION OF EMBODIMENTS

[Pressure-Sensitive Touch Sensor]

Figure 1:
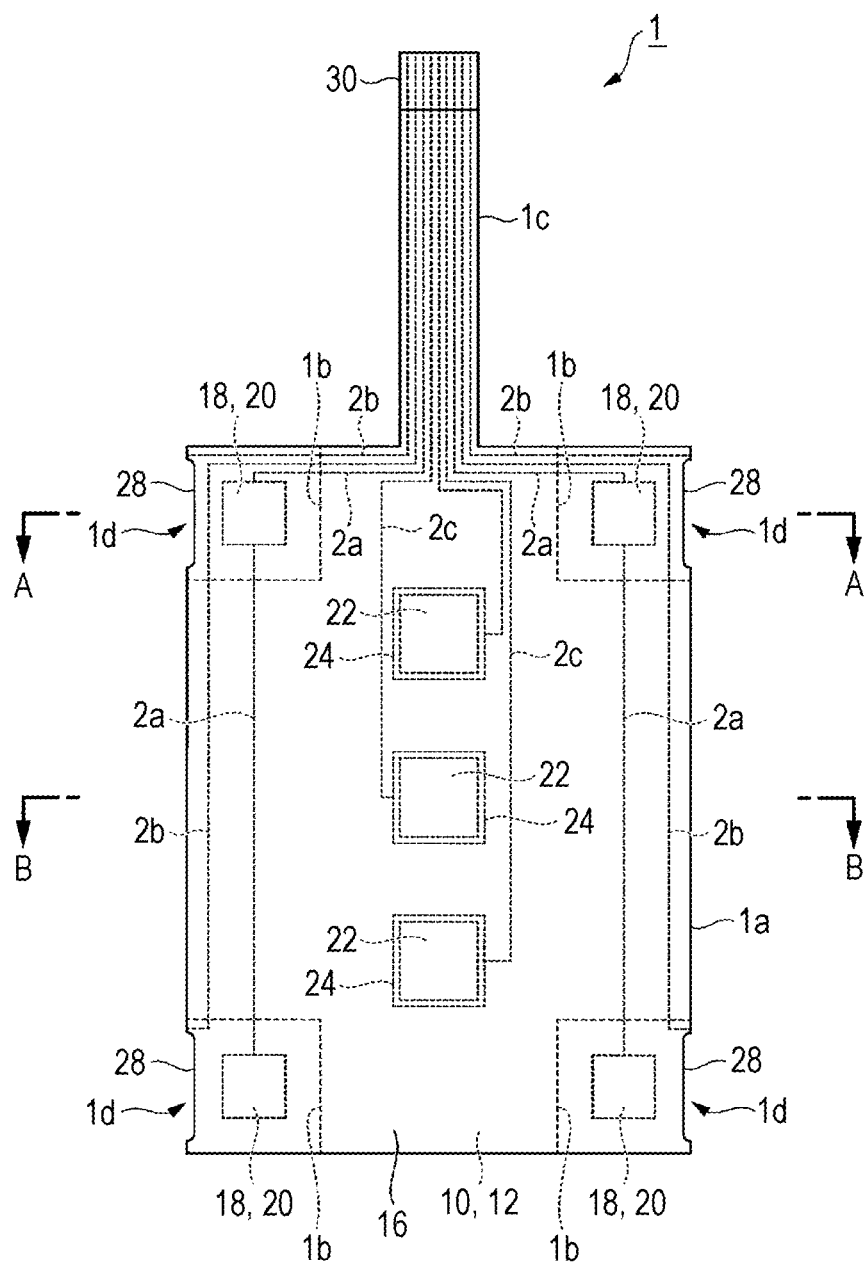
FIG. 1 is a plan view for illustrating an example of a pressure-sensitive touch sensor of this disclosure.

A pressure-sensitive touch sensor of this disclosure is a pressure-sensitive touch sensor of a capacitance type, which is configured to detect pressing on an operation surface. Now, one example of the pressure-sensitive touch sensor of this disclosure is described.

In the following description, dimensions or the like exemplified in the drawings are merely examples, and this disclosure is not necessarily limited to those dimensions or the like. Modifications can be made as appropriate without departing from the gist of this disclosure.

Figure 2:
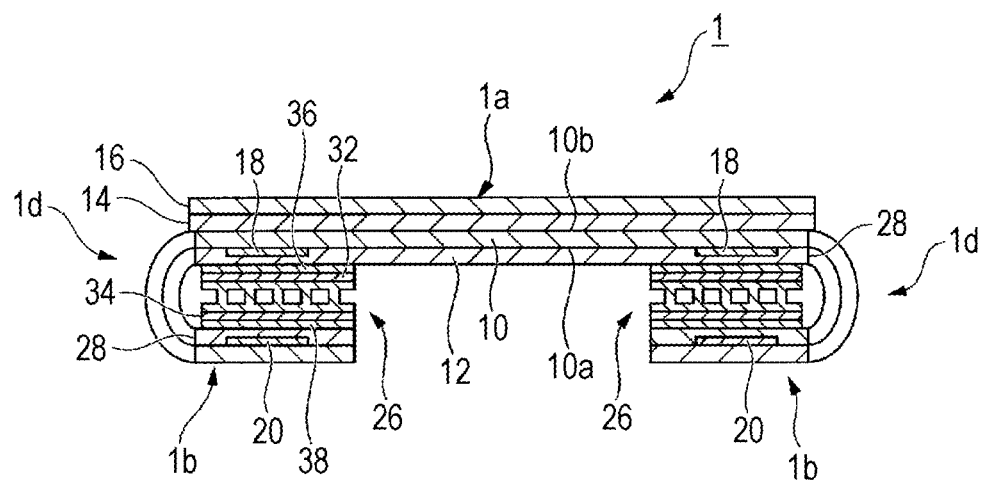
FIG. 2 is an A-A cross-sectional view of the pressure-sensitive touch sensor of FIG. 1.
Figure 3:
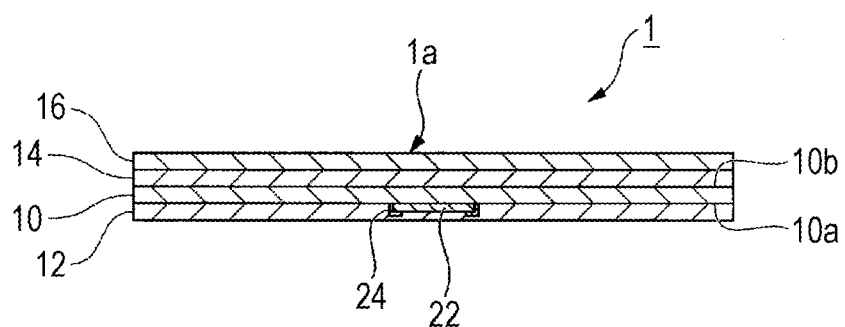
FIG. 3 is a B-B cross-sectional view of the pressure-sensitive touch sensor of FIG. 1.
Figure 4:
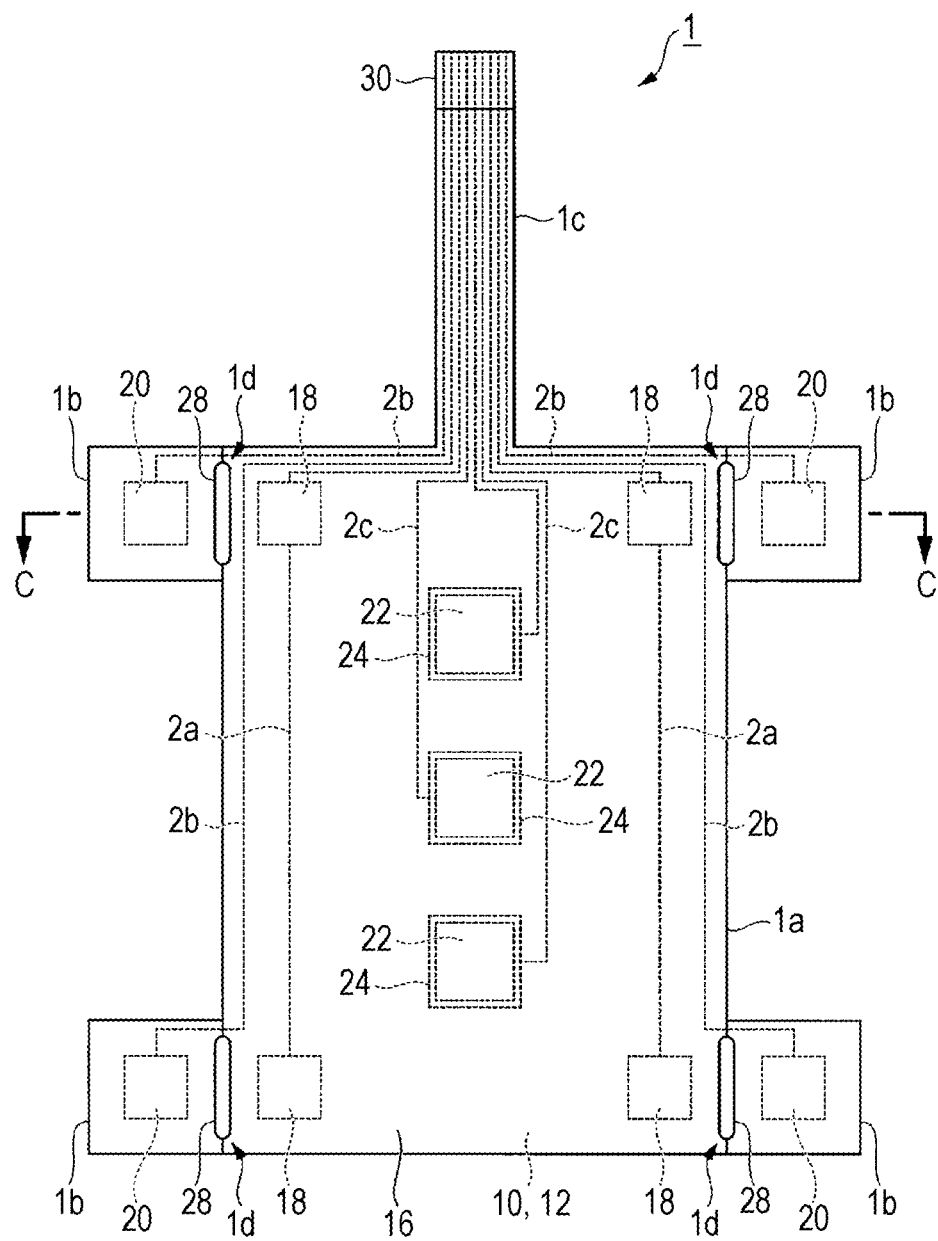
FIG. 4 is a plan view for illustrating a state of the pressure-sensitive touch sensor of FIG. 1 before folding portions thereof are folded.
Figure 5:
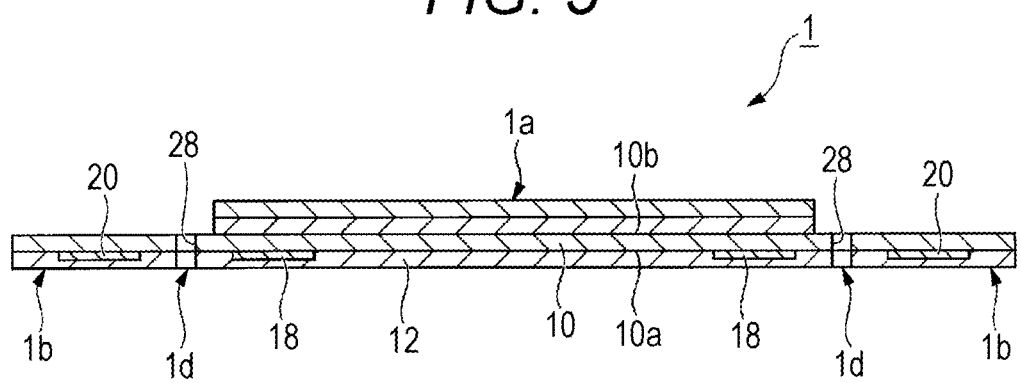
FIG. 5 is a C-C cross-sectional view of the pressure-sensitive touch sensor of FIG. 4.

FIG. 1 is a plan view for illustrating a pressure-sensitive touch sensor 1 of this embodiment. FIG. 2 and FIG. 3 are an A-A cross-sectional view and a B-B cross-sectional view, respectively, of the pressure-sensitive touch sensor 1 of FIG. 1. FIG. 4 is a plan view for illustrating a state of the pressure-sensitive touch sensor 1 of this embodiment before folding portions 1b thereof are folded. FIG. 5 is a C-C cross-sectional view of the pressure-sensitive touch sensor 1 of FIG. 4.

The pressure-sensitive touch sensor 1 of this embodiment includes, as illustrated in FIG. 1 to FIG. 5, a base material sheet 10, a protective layer 12, a pressure-sensitive adhesive layer 14, a release paper 16, four first electrodes 18, four second electrodes 20, three third electrodes 22, three auxiliary electrodes 24, and four elastic layers 26.

The pressure-sensitive touch sensor 1 in this example includes a main body portion 1a, four folding portions 1b, and a band-shaped portion 1c. The main body portion 1a has a rectangular shape in plan view. The folding portions 1b each have a rectangular shape in plan view, and are formed to protrude outward in a width direction from four corner portions of the main body portion 1a. The band-shaped portion 1c has a band shape extending from a short side of the main body portion 1a.

On a first surface 10a of the base material sheet 10, the first electrodes 18, the second electrodes 20, the third electrodes 22, and the auxiliary electrodes 24 are provided, and the protective layer 12 is laminated to cover those electrodes. The protective layer 12 is laminated on the first surface 10a side of the base material sheet 10 entirely across the main body portion 1a, the folding portions 1b, and the band-shaped portion 1c in the pressure-sensitive touch sensor 1. On a second surface 10b side of the base material sheet 10, the release paper 16 is bonded through intermediation of the pressure-sensitive adhesive layer 14. The pressure-sensitive adhesive layer 14 and the release paper 16 are not provided at the folding portions 1b of the pressure-sensitive touch sensor 1, and are provided at parts of the main body portion 1a and the band-shaped portion 1c.

The shape of the base material sheet 10 is not limited to the shape in this example, and can be set as appropriate depending on usage. The dimension of the base material sheet 10 is not particularly limited as well, and can be set as appropriate depending on usage.

As the base material sheet, a transparent resin insulating film can be used. In this case, "transparent" means that light beam transmittance measured based on JIS K7136 is 50% or more. Further, "insulating" means that an electrical resistance value is 1 MΩ or more, preferably 10 MΩ or more.

As a material for forming the base material sheet, there are given, for example, polyester, such as polyethylene terephthalate (PET), polycarbonate (PC), an acrylic resin, a cyclic polyolefin resin, and triacetyl cellulose.

Those materials for forming the base material sheet may be used alone or in combination thereof.

The average thickness of the base material sheet is preferably from 10 μm to 250 μm, and more preferably from 25 μm to 188 μm. When the average thickness of the base material sheet is equal to or larger than the lower limit value of the above-mentioned range, it becomes easier to ensure a sufficient strength and rigidity. When the average thickness of the base material sheet is equal to or smaller than the upper limit value of the above-mentioned range, the pressure-sensitive touch sensor can be easily reduced in thickness.

The numerical range expressed by "from . . . to . . . " herein represents a numerical range including numerical values described before and after "to" as the lower limit value and the upper limit value.

The shape and the dimension of the protective layer 12 are not limited to those in this example, and can be set as appropriate depending on usage.

The protective layer is not particularly limited, and may be, for example, the same transparent resin insulating film as that given for the base material sheet.

The average thickness of the protective layer is preferably from 10 μm to 250 μm, and more preferably from 10 μm to 188 μm. When the average thickness of the protective layer is equal to or larger than the lower limit value of the above-mentioned range, it becomes easier to ensure a sufficient strength and rigidity. When the average thickness of the protective layer is equal to or smaller than the upper limit value of the above-mentioned range, the pressure-sensitive touch sensor can be easily reduced in thickness.

In the pressure-sensitive touch sensor 1, as illustrated in FIG. 1 and FIG. 2, the four folding portions 1b are folded toward the main body portion 1a. Further, as illustrated in FIG. 1, FIG. 2, FIG. 4, and FIG. 5, in each fold line portion 1d at which the folding portion 1b of the pressure-sensitive touch sensor 1 is folded, that is, in parts of the base material sheet 10 and the protective layer 12 at a boundary line between the main body portion 1a and the folding portion 1b, a linear slit 28 is formed along a length direction of the fold line portion 1d. In this manner, as illustrated in FIG. 1 and FIG. 2, in the pressure-sensitive touch sensor 1, each folding portion 1b can be easily folded toward the main body portion 1a side through use of the slit 28. Further, with the slit 28 being formed, under a state in which the folding portion 1b is folded, a force of the folding portion 1b trying to return to its original state before the folding is weakened.

In this example, the slit 28 is continuously formed as a solid line, but the slit 28 may be intermittently formed as a broken line.

The length of the slit 28 can be set as appropriate depending on the length of the fold line portion at the part to be folded.

The width of the slit 28 can be set as appropriate, and may be, for example, from 0.5 mm to 10 mm, preferably from 0.5 mm to 5 mm, and more preferably from 1 mm to 3 mm. When the width of the slit 28 is equal to or larger than the lower limit value of the above-mentioned range, it becomes easier to sandwich the elastic layer. When the width of the slit 28 is equal to or smaller than the upper limit value of the above-mentioned range, the product size is less liable to be increased.

As illustrated in FIG. 2, it is preferred that the pressure-sensitive adhesive layer 14 and the release paper 16 not be provided at the fold line portion 1d of the pressure-sensitive touch sensor 1. When the pressure-sensitive adhesive layer 14 or the release paper 16 is provided at the fold line portion 1d, the pressure-sensitive adhesive layer 14 or the release paper 16 may affect the folded folding portion 1b to increase the force of the folding portion 1b trying to return to its original state. When the pressure-sensitive adhesive layer 14 and the release paper 16 are not provided at the fold line portion 1d, the force of the folded folding portion 1b trying to return to its original state is weakened, and the first electrode 18 and the second electrode 20 can maintain a stable distance. Therefore, the accuracy of detecting the capacitance change caused by pressing is further increased. Further, it becomes easier to suppress breakage of the pressure-sensitive adhesive layer 14 and damage of the release paper when the folding portion 1b is folded. Further, when, for example, the pressure-sensitive touch sensor 1 is bonded to an operation panel or when a pressing operation is performed, an unexpected portion of the pressure-sensitive touch sensor 1 is less liable to be bonded to the operation panel. Thus, loss of restorability of the elastic layer 26 to be compressed and deformed is suppressed.

The first electrodes 18 and the second electrodes 20 are pressure-sensitive electrodes for detecting pressing on the operation surface. Each first electrode 18 and each second electrode 20 are connected, through wiring lines 2a and 2b, respectively, to a connection terminal portion 30 formed at a leading end part of the band-shaped portion 1c, and are further electrically connected to a capacitance detection portion (not shown) via the connection terminal portion 30.

In the pressure-sensitive touch sensor 1, the second electrodes 20 are respectively provided in the four folding portions 1b on the first surface 10a of the base material sheet 10. Further, the first electrodes 18 are provided at positions that are line-symmetric to the second electrodes 20 with respect to the silts 28 at four corners of the main body portion 1a on the first surface 10a of the base material sheet 10. As described above, in this example, the slit 28 is formed between the first electrode 18 and the second electrode 20 in the base material sheet 10 and the protective layer 12. As illustrated in FIG. 2, under a state in which the folding portion 1b is folded toward the main body portion 1a side so that the first surface 10a of the base material sheet 10 is located on the inner side, the first electrode 18 and the second electrode 20 overlap each other as viewed from the thickness direction of the base material sheet 10, and surfaces of those electrodes face each other.

In the pressure-sensitive touch sensor of this disclosure, the folding portion 1b may be folded so that the second surface 10b of the base material sheet 10 is located on the inner side.

In this example, the shapes of the first electrode 18 and the second electrode 20 are rectangular shapes in plan view. The shapes of the first electrode 18 and the second electrode 20 are not limited to the rectangular shapes, and can be set as appropriate.

The dimensions of the first electrode 18 and the second electrode 20 are not particularly limited as well, and may be, for example, about 10 mm by 10 mm vertically and horizontally. As the first electrode 18 and the second electrode 20 become larger, the detection sensibility of the pressing force is improved.

In this disclosure, of the first electrode and the second electrode, the electrode present on the side farther from the operation surface may have a size smaller than that of the electrode present on the side closer to the operation surface. For example, in the pressure-sensitive touch sensor 1, the second electrode 20 may have a size smaller than that of the first electrode 18. In this manner, as viewed from the thickness direction, the electrode present on the side farther from the operation surface is less liable to protrude from the electrode present on the side closer to the operation surface, and hence it becomes much easier to suppress erroneous detection.

The first electrode 18 is preferred to be grounded. In this manner, even when a finger approaches the first electrode 18, the first electrode 18 serves as a shield to suppress the change in capacitance. In this manner, an influence caused when the finger trying to touch the operation surface approaches the first electrode 18 can be eliminated from the change in capacitance of the first electrode 18 and the second electrode 20, and the change can be limited to that caused by an influence of the pressing force. Therefore, erroneous detection of the pressing can be further suppressed.

As the first electrode 18 and the second electrode 20, pressure-sensitive electrodes of publicly-known modes can be adopted, and the electrodes may employ a self-capacitance system or a mutual-capacitance system.

As the self-capacitance system, for example, there is given a mode in which the first electrode 18 and the second electrode 20 are both solid electrodes, and the first electrode 18 is grounded.

As the mutual-capacitance system, for example, there is given a mode in which the first electrode 18 and the second electrode 20 are both solid electrodes, and those electrodes are set as a transmission electrode and a reception electrode. Further, there may be also employed a mode in which the first electrode 18 is formed as a grounded solid electrode, and the second electrode 20 is formed as an electrode in which the transmission electrode and the reception electrode are arranged in a comb shape.

The materials of the first electrode 18 and the second electrode 20 are not particularly limited, and electrodes generally used as pressure-sensitive electrodes can be used. Examples thereof include copper and silver. Depending on usage, indium-doped tin oxide (ITO), a conductive polymer, silver nanowires, a silver paste, carbon, graphite, carbon nanotubes, and the like may be used as the electrode materials. Of those, a silver paste is preferred as the electrode materials for the first electrode 18 and the second electrode 20.

In this case, "conductive" means that the electrical resistance value is less than 1 MΩ.

The average thicknesses of the first electrode 18 and the second electrode 20 may be set as appropriate depending on material, and the preferred range of the average thicknesses of the first electrode 18 and the second electrode 20 is similar to the preferred range of the average thickness of the third electrode to be described later.

In this example, four first electrodes 18 and four second electrodes 20 are provided, but the number of the first electrodes 18 and the number of the second electrodes 20 are not particularly limited. The number of the first electrodes 18 may be 3 or less, or 5 or more. Similarly, the number of the second electrodes 20 may be 3 or less, or 5 or more.

The materials of the wiring lines 2a and 2b may be, for example, the same materials as those of the first electrode 18 and the second electrode 20, and a silver paste is preferred.

The preferred range of the average thicknesses of the wiring lines 2a and 2b is similar to the preferred range of the average thickness of the third electrode to be described later.

Further, in the pressure-sensitive touch sensor 1, under a state in which the four folding portions 1b are folded, the elastic layer 26 is provided between the main body portion 1a and each folding portion 1b. In this example, under a state in which the four folding portions 1b are folded, each elastic layer 26 is positioned between the first electrode 18 and the second electrode 20.

The elastic layer 26 is a layer including an elastic body, and is compressed and deformed by pressing. When the pressure-sensitive touch sensor 1 is pressed in the thickness direction, the elastic layer 26 is compressed and deformed in the thickness direction, and thus the distance between the first electrode 18 and the second electrode 20 is reduced to change the capacitance. The pressing on the operation surface is recognized when this change in capacitance is detected.

In general, when the base material sheet is partially folded, the folded part tries to open to return to its original unfolded state. Therefore, in the pressure-sensitive touch sensor as in Patent Literature 1, the force of the folded part trying to return to its original state causes difficulty in maintaining a constant distance between the first electrode and the second electrode. Therefore, it is considered that the accuracy of detecting the capacitance change caused by pressing is reduced.

In contrast, in the pressure-sensitive touch sensor 1, as described above, the slit 28 is formed in the fold line portion 1d at which the folding portion 1b for the base material sheet 10 and the protective layer 12 is folded. In this manner, the force of the folding portion 1b trying to return to its original state is weakened, and the first electrode 18 and the second electrode 20 can maintain a stable distance. Therefore, the accuracy of detecting the capacitance change caused by pressing is increased, and erroneous detection of pressing is suppressed.

In this disclosure, as in this example, the slit is preferred to be formed at least between the first electrode and the second electrode in the base material sheet. In this manner, the force of the folded part trying to return to its original state is more weakened, and the first electrode 18 and the second electrode 20 can maintain a more stable distance. Therefore, the accuracy of detecting pressing is further increased.

Figure 6:
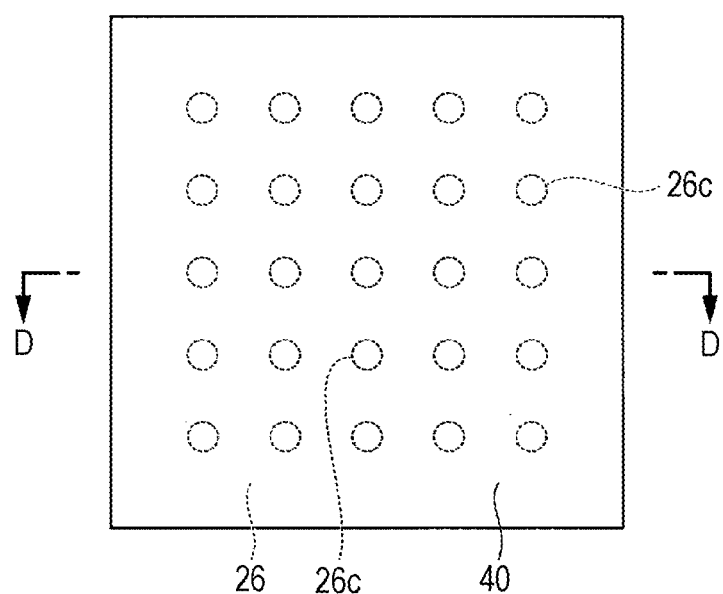
FIG. 6 is a plan view for illustrating a state of an elastic layer in the pressure-sensitive touch sensor of FIG. 1 before the elastic layer is provided between folded parts.
Figure 7:
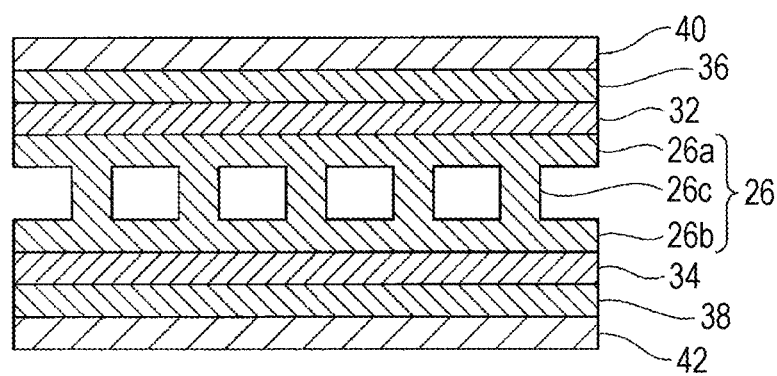
FIG. 7 is a D-D cross-sectional view of the elastic layer of FIG. 6.

The elastic layer 26 in this example is, as illustrated in FIG. 6 and FIG. 7, a rubber-like elastic body including a pair of a first sheet portion 26a and a second sheet portion 26b, and a plurality of column portions 26c sandwiched between the first sheet portion 26a and the second sheet portion 26b. The first sheet portion 26a, the second sheet portion 26b, and the plurality of column portions 26c are integrally formed.

Sponge or other elastic members may be arranged at space portions other than the column portions 26c between the first sheet portion 26a and the second sheet portion 26b. In this manner, it becomes easier to suppress excessive compression and deformation of the elastic layer 26 causing damage of the fold line portion 1d in the base material sheet 10 or the protective layer 12.

The first sheet portion 26a, the second sheet portion 26b, and the plurality of column portions 26c may be formed of the same material or different materials. In the elastic layer 26, only the column portions 26c to be compressed and deformed are required to be formed of an elastic body. The first sheet portion 26a and the second sheet portion 26b may be formed of an elastic material, or may be formed of a non-elastic hard material. Examples of the hard material include a resin other than an elastomer, glass, a metal, ceramics, and wood.

As the elastic material forming the elastic body of the elastic layer 26, it is preferred to use a material that allows a moderate degree of compression and deformation in the thickness direction by pressing, and provides a satisfactory pressing feeling. Examples of the elastic material include a thermosetting elastomer, a thermoplastic elastomer, and a composite thereof. Examples of the thermosetting elastomer include a urethane rubber, an isoprene rubber, an ethylene propylene rubber, a natural rubber, an ethylene propylene diene rubber, a styrene butadiene rubber, and a silicone rubber. Examples of the thermoplastic elastomer include a urethane-based elastomer, an ester-based elastomer, a styrene-based elastomer, an olefin-based elastomer, a butadiene-based elastomer, and a fluorine-based elastomer. Among them, the silicone rubber is preferred from the viewpoint of having a small dimensional change with respect to repetitive pressing, that is, a small compression set. The elastic material may be a foamed material containing bubbles therein, or may be a non-foamed material containing substantially no bubbles.

The Shore A hardness to be obtained when measurement is performed with the thickness (height) of the elastic body forming the elastic layer 26 being set to 1 cm is preferred to be 85 or less. When the Shore A hardness is 85 or less, elastic deformation is easily achieved at the time of pressing. However, excessively low hardness causes slow recovery after the elastic deformation, and hence the Shore A hardness is preferred to be 10 or more.

The average thickness of the first sheet portion 26a is preferably from 5 μm to 100 μm, and more preferably from 10 μm to 100 μm. When the average thickness of the first sheet portion 26a is equal to or larger than the lower limit value of the above-mentioned range, the bonding strength of bonding to the column portions 26c can be increased. When the average thickness of the first sheet portion 26a is equal to or smaller than the upper limit value of the above-mentioned range, it becomes easier to reduce the distance between the first electrode 18 and the second electrode 20 under a state in which the operation surface is not pressed, and the accuracy of detecting pressing can be further increased.

The preferred range of the average thickness of the second sheet portion 26b is the same as the preferred range of the average thickness of the first sheet portion 26a. The first sheet portion 26a and the second sheet portion 26b may have the same average thickness or different average thicknesses.

The shape of the column portion 26c is not particularly limited, and examples of the shape include a cylinder shape, a truncated cone shape, a prism shape, and other columnar shapes. Among them, the cylinder shape and the truncated cone shape are preferred from the viewpoint of having excellent durability. The plurality of column portions 26c may have the same shape or different shapes.

The cross-sectional area of one column portion 26c in a direction perpendicular to the height direction thereof is not particularly limited. For example, the cross-sectional area may be from 0.005 mm$^2$ to 4 mm$^2$, preferably from 0.02 mm$^2$ to 0.8 mm$^2$. When the cross-sectional area of the column portion 26c is equal to or larger than the lower limit value of the above-mentioned range, it becomes easier to achieve compression and deformation in the height direction when a pressing force is applied, and the column portion 26c is easily prevented from being bent without being compressed. When the cross-sectional area of the column portion 26c is equal to or smaller than the upper limit value of the above-mentioned range, the compression and deformation can be easily achieved by a moderate pressing force at a degree of finger pressing.

In this case, the cross-sectional area of the column portion means an area of a cross section orthogonal to the height direction at a position of ½ of the height of the column portion. The cross-sectional area of the column portion can be measured by an optical microscope measuring machine or other publicly-known fine-structure observing means.

The total cross-sectional area of all column portions 26c included in the elastic layer 26 can be set as appropriate depending on the physical property of the elastic material and set pressing feeling. When the area of the first sheet portion 26a or the second sheet portion 26b is 100%, the above-mentioned total cross-sectional area is preferably from 0.1% to 30%, more preferably from 0.5% to 20%, and further preferably from 1% to 10%. When the above-mentioned total cross-sectional area is within the above-mentioned range, the compression and deformation can be easily achieved by a moderate pressing force at the degree of finger pressing.

Specifically, for example, the above-mentioned total cross-sectional area may be from 1 mm$^2$ to 100 mm$^2$.

The average height of the column portion 26c is preferably from 1 μm to 3,000 μm, more preferably from 50 μm to 2,000 μm, further preferably from 200 μm to 1,000 μm, and particularly preferably from 300 μm to 1,000 μm. When the average height of the column portion 26c is equal to or smaller than the upper limit value of the above-mentioned range, it becomes easier to reduce the distance between the first electrode 18 and the second electrode 20 under a state in which the operation surface is not pressed, and the accuracy of detecting the pressing force can be further increased. Further, it becomes easier to suppress the sense that the operation surface dents when the operation surface is pressed, and an operation may be performed with the same sense as that obtained when a hard surface as that of a general touch panel is touched.

In this case, the height of the column portion 26c does not include the thickness of the first sheet portion 26a and the thickness of the second sheet portion 26b. The height of the column portion 26c can be measured by an optical microscope measuring machine or other publicly-known fine-structure observing means.

The column portion 26c is a member connected to the first sheet portion 26a and the second sheet portion 26b and configured to support the thickness of the elastic layer 26. When the elastic layer 26 has the same thickness irrespective of part, the plurality of column portions 26c have substantially the same height.

The arrangement pattern of the plurality of column portions 26c in this example in plan view is a pattern in which, in a planar direction of the rectangular first sheet portion 26a and second sheet portion 26b, twenty-five (5×5) column portions 26c are arrayed at intervals in the vertical direction and the horizontal direction. The arrangement pattern of the plurality of column portions 26c is not limited to this pattern, and may be, for example, a pattern in which the plurality of column portions 26c are arrayed in a staggered manner.

The number of the column portions 26c included in the elastic layer 26 may be plural or 1. For example, there may be employed a mode in which one column portion 26c having a rectangular shape in plan view is provided in center regions of the first sheet portion 26a and the second sheet portion 26b in the planar direction. In the case of this mode, the elastic body forming the column portion 26c is preferred to be a foamed material containing bubbles therein.

The number of the column portions 26c included in the elastic layer 26 is preferably from 1 to 1,000, more preferably from 3 to 100, and further preferably from 4 to 50. When the above-mentioned number is equal to or larger than the lower limit value of the above-mentioned range, the elastic layer 26 can be compressed and deformed by a moderate pressing force at a degree of pressing the operation surface by the finger. When the above-mentioned number is equal to or smaller than the upper limit value of the above-mentioned range, the accuracy of detecting pressing at the degree of finger pressing can be improved.

The average pitch of column portions 26c adjacent to each other is preferably from 0.1 mm to 5 mm, and more preferably from 0.5 mm to 3 mm. When the above-mentioned average pitch is equal to or larger than the lower limit value of the above-mentioned range, the elastic layer 26 can be compressed and deformed by a moderate pressing force at a degree of pressing the operation surface by the finger. When the above-mentioned average pitch is equal to or smaller than the upper limit value of the above-mentioned range, the accuracy of detecting pressing at the degree of finger pressing can be improved.

As illustrated in FIG. 2, the elastic layer 26 in this example is arranged between parts at which the folding portion 1b for the base material sheet 10 and the protective layer 12 is folded, under a state in which the elastic layer 26 is sandwiched between a first base material film 32 and a second base material film 34. The elastic layer 26 is caused to adhere to the protective layer 12 through intermediation of adhesive layers 36 and 38. The elastic layer 26 is caused to adhere to the protective layer 12 through use of the adhesive layers 36 and 38 so that a side edge of the elastic layer 26 on the fold line portion 1d side is positioned closer to the fold line portion 1d than side edges of the first electrode 18 and the second electrode 20 on the fold line portion 1d side. As described above, the elastic layer 26 is bonded to be closer to the fold line portion 1d than the first electrode 18 and the second electrode 20, and thus it becomes easier to suppress warping and opening of a part of the folded folding portion 1b on the fold line portion 1d side. Therefore, the first electrode 18 and the second electrode 20 can maintain a stable distance, and the detection accuracy is improved.

Before the elastic layer 26 is arranged between the parts at which the folding portion 1b is folded, as illustrated in FIG. 6 and FIG. 7, release papers 40 and 42 are laminated on the surfaces of the adhesive layers 36 and 38, respectively.

The adhesive layers 36 and 38 may be each provided in only a part of a close-contact surface of the first base material film 32 or the second base material film 34 to be brought into close contact with the protective layer 12, or may be each provided entirely on the close-contact surface. It is preferred to provide each of the adhesive layers 36 and 38 entirely on the close-contact surface from the viewpoint that the pressing force with respect to the elastic layer 26 can be easily equalized in the planar direction.

The materials of the adhesive layers 36 and 38 may be independently, for example, a publicly-known curable adhesive (adhesive that is liquid before adhesion) or a pressure-sensitive adhesive (pressure-sensitive adhesive that is gel before adhesion). Moreover, the adhesive layer may be a base material adhesive layer in which an adhesive or a pressure-sensitive adhesive is arranged on both sides of a base material layer. Examples of the base material adhesive layer include a publicly-known double-sided tape.

Examples of the adhesive and the pressure-sensitive adhesive include an acrylic resin, a polyurethane resin, and an ethylene vinyl acetate copolymer. The curable adhesive may be of a solvent type containing a solvent, which volatilizes during curing, or of a hot melt type.

The thicknesses of the adhesive layers 36 and 38 may be independently, for example, from 1 µm to 75 µm. The thicknesses of the adhesive layers 36 and 38 using the curable adhesive are preferably from 1 µm to 20 µm. The thicknesses of the adhesive layers 36 and 38 using the pressure-sensitive adhesive are preferably from 10 µm to 75 µm.

As each of materials for forming the first base material film 32 and the second base material film 34, an insulating resin material may be used. Examples of the materials each independently include PET, polybutylene terephthalate (PBT), polycarbonate (PC), polyvinyl chloride (PVC), polymethyl methacrylate (PMMA), and urethane. Those resins for forming the first base material film 32 and the second base material film 34 may be used alone or in combination thereof.

The average thicknesses of the first base material film 32 and the second base material film 34 may be independently, for example, from 10 µm to 200 µm. When the above-mentioned resin material is used, the thicknesses are preferably from 10 µm to 200 µm, more preferably from 25 µm to 150 µm, and further preferably from 25 µm to 100 µm. When the average thicknesses are equal to or larger than the lower limit value of the above-mentioned range, it becomes easier to equalize the pressing force with respect to the elastic layer 26 in the planar direction. When the average thicknesses are equal to or smaller than the upper limit value of the above-mentioned range, the accuracy of detecting the input with respect to the operation surface can be increased.

The first base material film 32 and the second base material film 34 are caused to adhere to an outer surface of the first sheet portion 26a and an outer surface of the second sheet portion 26b of the elastic layer 26, respectively. Those base material films may be caused to adhere thereto through use of adhesive layers (not shown), or may be caused to directly adhere thereto by publicly-known surface treatment or heating treatment.

The adhesion surfaces of the first base material film 32 and the second base material film 34 may be subjected to publicly-known physical or chemical surface treatment for the purpose of improving the adhesive force.

The first base material film 32 and the second base material film 34 each have a smooth surface with respect to the elastic layer 26 so that the pressing force applied to the operation surface is uniformly transmitted to the elastic layer 26. If the first base material film 32 and the second base material film 34 are absent, irregularities of parts at which the first electrode 18 and the second electrode 20 are provided may cause non-uniform pressing with respect to the elastic layer 26. In this embodiment, the first base material film 32 and the second base material film 34 are provided, and hence an influence that occurs when the irregularities of the parts at which the first electrode 18 and the second electrode 20 are provided cause non-uniform pressing with respect to the elastic layer 26 can be reduced. Further, local damage of the first electrode 18 and the second electrode 20 resulting from a stress received from the column portion 26c of the elastic layer 26 is suppressed.

The pressure-sensitive touch sensor 1 includes, at a center portion in the width direction on the first surface 10a of the base material sheet 10, three third electrodes 22 provided at intervals in the length direction. The third electrodes 22 are touch electrodes for detecting contact of a conductor onto the operation surface.

In this disclosure, it is preferred to further provide the third electrodes serving as touch electrodes on the first surface of the base material sheet as described above, in addition to the first electrodes and the second electrodes for detecting the pressing on the operation surface. In this manner, the operation on the operation surface can be determined and recognized at two levels of finger contact and pressing, and thus erroneous detection can be more stably suppressed.

In this example, the shape of the third electrode 22 is a rectangular shape in plan view. The shape of the third electrode 22 is not limited to the rectangular shape, and can be set as appropriate. The dimension of the third electrodes 22 is not particularly limited as well, and may be, for example, about 10 mm by 10 mm vertically and horizontally.

The third electrode 22 may employ a self-capacitance system or a mutual-capacitance system.

The mode of the third electrode 22 employing the mutual-capacitance system is not particularly limited, and may be, for example, a circular, elliptical, or rectangular solid electrode, a comb electrode, a crossing electrode pattern in which a band-shaped transmission electrode is formed on one surface of a base material, and a plurality of band-shaped reception electrodes extending in a direction orthogonal to the transmission electrode are formed on another surface thereof, or a diamond pattern.

The mode of the third electrode 22 employing the self-capacitance system is not particularly limited, and may be, for example, a circular, elliptical, or rectangular solid electrode or a diamond pattern.

As the third electrode 22, a transparent conductive film can be used.

Examples of the transparent conductive film include a film containing conductive polymers, a film containing conductive nanowires, a film containing metal particles or conductive metal oxide particles, a film containing carbon, and a metal deposition film formed by metal deposition. As the transparent conductive film, the film containing conductive polymers is preferred from the viewpoint of having an excellent bending resistance.

Examples of the conductive polymer include polythiophene, polypyrrole, and polyaniline. Of those conductive polymers, polythiophene is preferred, and poly(3,4-ethylenedioxythiophene) doped with polystyrene sulfonate is particularly preferred.

Examples of the conductive nanowires include silver nanowires, gold nanowires, and carbon nanotubes.

Examples of the metal particles include particles of metals such as silver, copper, and gold.

Examples of the conductive metal oxide particles include particles of indium-doped tin oxide.

Examples of the carbon include carbon black and graphite.

As a metal for forming the metal deposition film, there are given, for example, copper, aluminum, nickel, chromium, zinc, and gold. Of those, copper is preferred because of having low electrical resistance and a low cost.

The average thickness of the third electrode 22 formed of the transparent conductive film containing conductive polymers is preferably from 0.1 µm to 5.0 µm, and more preferably from 0.1 µm to 2.0 µm.

The average thickness of the third electrode 22 formed of the transparent conductive film containing metal nanowires is preferably from 20 nm to 1,000 nm, and more preferably from 50 nm to 300 nm.

The average thickness of the third electrode 22 formed of the transparent conductive film containing metal particles, conductive metal oxide particles, or carbon is preferably from 0.01 µm to 25 µm, and more preferably from 0.1 µm to 15 µm.

The average thickness of the third electrode 22 formed of the transparent conductive film containing metal deposition film is preferably from 0.01 µm to 1.0 µm, and more preferably from 0.05 µm to 0.3 µm.

When the average thickness of the third electrode 22 is equal to or larger than the lower limit value of the above-mentioned range, it becomes easier to suppress disconnection due to a pinhole. When the average thickness of the third electrode 22 is equal to or smaller than the upper limit value of the above-mentioned range, reduction in thickness becomes easier.

The method of measuring the thickness of the electrode varies depending on the thickness range. For example, when the film thickness is on the order of µm, the thickness can be measured by a micrometer or a digimatic indicator, or through laser displacement measurement. Further, when the film thickness is thinner than the order of µm, the thickness can be measured through cross-section observation using a scanning electron microscope or by an X-ray fluorescence spectrometer.

The average thickness is an average value of the thickness measured in the vicinity of the center in the electrode.

In this example, the number of the third electrodes is 3, but the number of the third electrodes 22 is not particularly limited. The number of the third electrodes 22 may be 2 or less, or 4 or more.

In the pressure-sensitive touch sensor, each of the auxiliary electrodes 24 is provided in contact with the third electrode 22 along its entire circumference to surround the third electrode 22. Each of the auxiliary electrodes 24 is connected, through a wiring line 2c, to the connection terminal portion 30 formed at the leading end part of the band-shaped portion 1c, and is further electrically connected to the capacitance detection portion (not shown) via the connection terminal portion 30. In this manner, the third electrodes 22 can be connected to the capacitance detection portion.

When the auxiliary electrodes 24 are provided, as compared to a case in which the third electrode 22 and the wiring line 2c are brought into point contact with each other, an influence of a resistance can be reduced. Therefore, even when the third electrodes 22 are each formed of a conductive polymer having a relatively high resistance, a high detection accuracy can be ensured.

The material of the auxiliary electrode 24 may be, for example, the same materials as those of the first electrode 18 and the second electrode 20, and a silver paste is preferred.

The preferred range of the average thickness of the auxiliary electrode 24 is similar to the preferred range of the average thickness of the third electrode 22.

The pressure-sensitive adhesive forming the pressure-sensitive adhesive layer 14 is not particularly limited, and may be, for example, pressure-sensitive adhesives given for the adhesive layers 36 and 38.

The release paper 16 is not particularly limited, and a publicly-known release paper can be used.

The method of manufacturing the pressure-sensitive touch sensor 1 is not particularly limited, and a publicly-known method can be used.

The first electrodes 18, the second electrodes 20, the third electrodes 22, and the auxiliary electrodes 24 can be manufactured by, for example, forming a pattern onto the base material sheet 10 through use of an electrode material by printing or other methods. Further, electrodes may be formed on one surface or both surfaces of a base material, and those electrodes may be bonded to the base material sheet 10 through use of, for example, an adhesive or double-sided tape. Examples of the method of forming the electrodes include a method of printing a conductive paste and then heating and curing the paste, a method of printing ink containing metal particles, and a method of forming a metal foil or a metal deposition film and then patterning the foil or film.

After the first electrodes 18, the second electrodes 20, the third electrodes 22, and the auxiliary electrodes 24 are formed, the protective layer 12 is bonded and laminated through use of, for example, an adhesive on the first surface 10*a* side of the base material sheet 10. Further, a pressure-sensitive adhesive is applied on the second surface 10*b* side of the base material sheet 10 to form the pressure-sensitive adhesive layer 14.

The elastic layer 26 can be manufactured by the following method, for example. Specifically, the second sheet portion 26*b* is formed on one surface of the second base material film 34 by screen printing or other methods. Ultraviolet rays are radiated to the surface of the second sheet portion 26*b* and a surface of each column portion 26*c* to be brought into contact with the second sheet portion 26*b*, and those surfaces are superimposed and pressurized. Thus, the second sheet portion 26*b* and each column portion 26*c* are bonded to each other. Further, the first sheet portion 26*a* is formed on one surface of the first base material film 32 by screen printing or other methods. Ultraviolet rays are radiated to the surface of the first sheet portion 26*a* and a surface of each column portion 26*c* to be brought into contact with the first sheet portion 26*a*, and those surfaces are superimposed and pressurized. Thus, the first sheet portion 26*a* and each column portion 26*c* are bonded to each other. In this manner, the elastic layer 26 sandwiched between the first base material film 32 and the second base material film 34 can be formed.

The folding portion 1*b* for the base material sheet 10 and the protective layer 12 is folded at the fold line portion 1*d* so that the first surface 10*a* of the base material sheet 10 is located on the inner side, to thereby cause the surface of the first electrode 18 and the surface of the second electrode 20 to face each other. Then, the elastic layer 26 is arranged between the folded parts so that the elastic layer 26 is caused to adhere to the protective layer 12 through intermediation of the adhesive layers 36 and 38. In this manner, the pressure-sensitive touch sensor 1 can be obtained.

[Pressure-Sensitive Touch Sensor Module]

Figure 8:
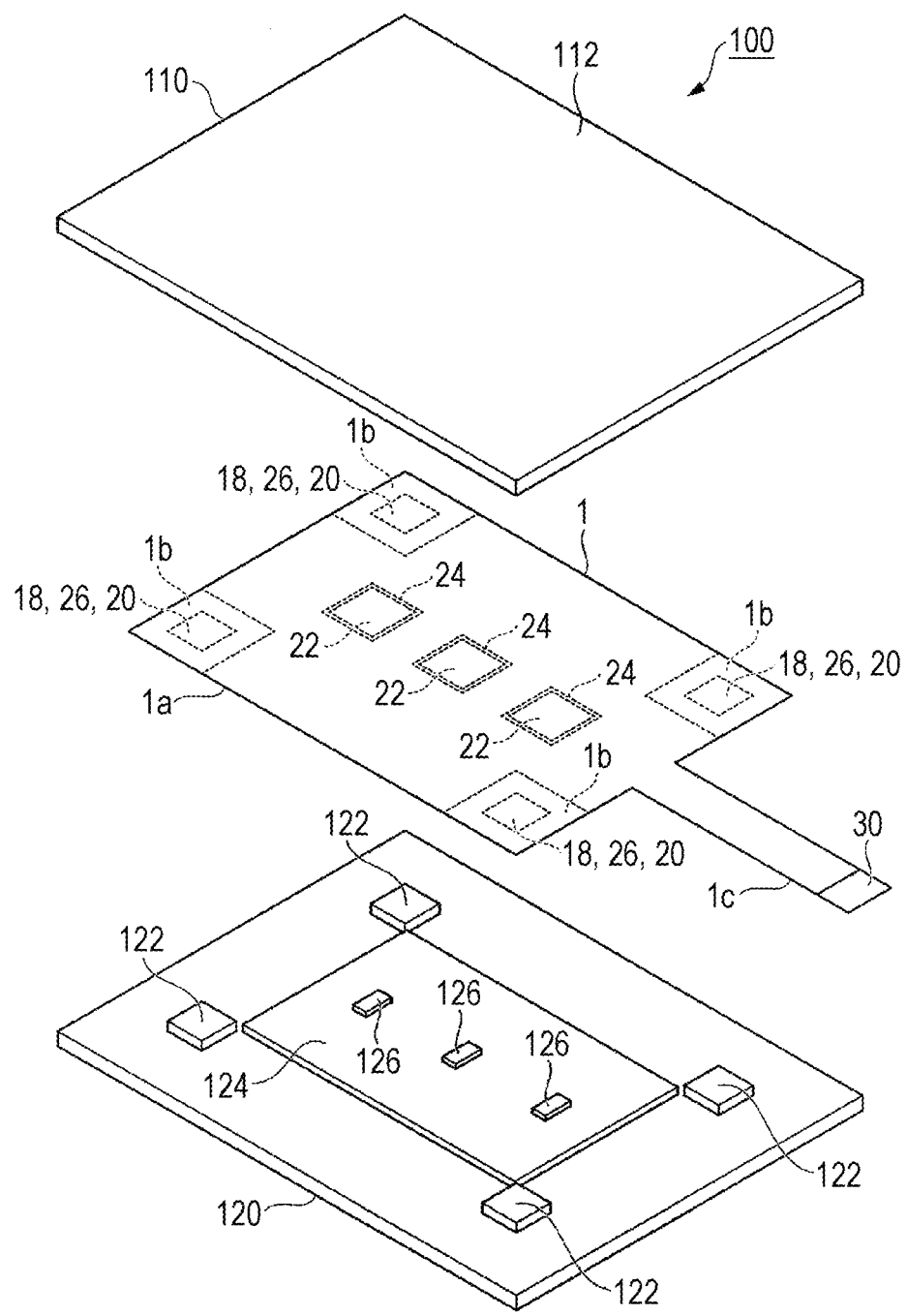
FIG. 8 is an exploded perspective view for illustrating one example of a pressure-sensitive touch sensor module of this disclosure.
Figure 9:
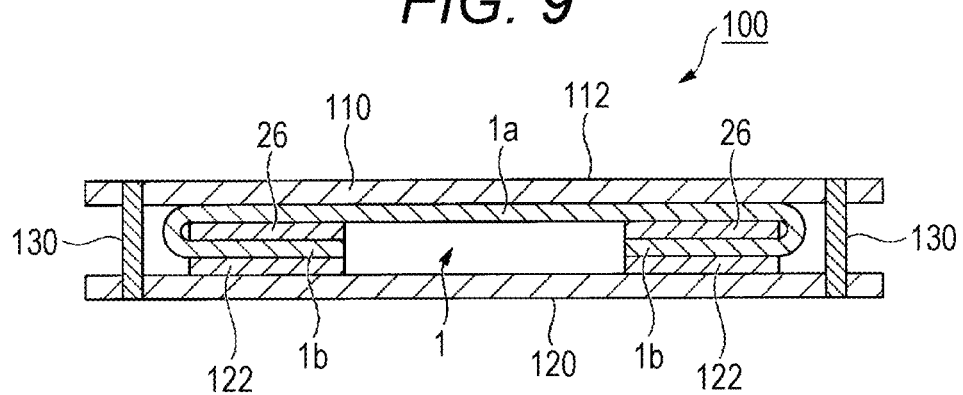
FIG. 9 is a cross-sectional view for illustrating the one example of the pressure-sensitive touch sensor module of this disclosure.

A pressure-sensitive touch sensor module according to this disclosure is a device including: an operation panel having an operation surface; a frame member; and the pressure-sensitive touch sensor of this disclosure, in which the pressure-sensitive touch sensor of this disclosure is sandwiched between the operation panel and the frame member. Now, as an example of the pressure-sensitive touch sensor module of this disclosure, a pressure-sensitive touch sensor module 100 (hereinafter also referred to as "module 100") including the pressure-sensitive touch sensor 1 is described with reference to FIG. 8 and FIG. 9.

The module 100 includes an operation panel 110, a frame member 120, and the pressure-sensitive touch sensor 1. The operation panel 110 has an operation surface 112. The frame member 120 includes four protrusions 122. The pressure-sensitive touch sensor 1 is sandwiched between the operation panel 110 and the frame member 120 under a state in which the folding portions 1*b* are folded and the elastic layers 26 are each provided between the folded parts. The frame member 120 is provided on the side on which the folding portions 1*b* of the pressure-sensitive touch sensor 1 are folded, and the operation panel 110 is provided on the opposite side of the side on which the folding portions 1*b* are folded. In this example, the operation panel 110 and the frame member 120 are connected to each other by springs 130.

The surface of the operation panel 110 on the opposite side of the pressure-sensitive touch sensor 1 corresponds to the operation surface 112.

As the operation panel 110, there can be used a panel having such a rigidity that, when the panel is pressed by a finger, the elastic layer present at a position apart from a finger pressing position can be compressed through the panel. However, when the pressing position and the position at which the elastic layer is present are close to each other, a panel having a low rigidity can be used as the operation panel 110. Examples of the operation panel 110 include a panel including a cover layer covering the surface of the pressure-sensitive touch sensor 1, and a decorative layer formed on the surface of the cover layer. The cover layer may be a layer also serving as a light guide layer configured to guide a light beam emitted from a light source in a planar direction.

As a material for the cover layer, there are given, for example, glass and a resin.

Examples of the resin include PC, an acrylic resin, an ABS resin, polystyrene (PS), PVC, PET, PBT, and polyethylene naphthalate (PEN). Those resins may be used alone or in combination thereof.

The average thickness of the cover layer is preferably from 0.05 mm to 10 mm, and more preferably from 2 mm to 5 mm. When the average thickness of the cover layer is equal to or larger than the lower limit value of the above-mentioned range, it becomes easier to obtain a sufficient strength. When the average thickness of the cover layer is equal to or smaller than the upper limit value of the above-mentioned range, it becomes easier to suppress excessive increase in thickness of the module 100. Further, the capacitance of the third electrode sufficiently changes when a finger touches the electrode, and thus it becomes easier to obtain a satisfactory detection accuracy.

The decorative layer is a layer decorated with decorations, letters, figures, symbols, patterns, or a combination thereof, or any decoration obtained by combining those with colors. The decorative layer can be formed by, for example, subjecting the cover layer to printing.

The operation panel 110 is not required to include the decorative layer.

The frame member 120 includes the four protrusions 122 each having a rectangular shape in plan view. The four protrusions 122 are provided at positions corresponding to the respective elastic layers 26 of the pressure-sensitive touch sensor 1 on the surface on the pressure-sensitive touch sensor 1 side. Under a state in which the pressure-sensitive touch sensor 1 is sandwiched between the operation panel 110 and the frame member 120, the four protrusions 122 are brought into pressure-contact with the folding portions 1*b* at which the elastic layers 26 are positioned in the pressure-sensitive touch sensor 1. As described above, the parts of the pressure-sensitive touch sensor 1 at which the elastic layers 26 are positioned are sandwiched between the operation panel 110 and the protrusions 122 of the frame member 120.

The protrusions 122 may be caused to adhere to the pressure-sensitive touch sensor 1 through use of a pressure-sensitive adhesive or the like. Even when the protrusions 122 are caused to adhere to the pressure-sensitive touch sensor 1 through use of a pressure-sensitive adhesive, it is preferred not to provide the pressure-sensitive adhesive for adhesion to the protrusions 122 at the fold line portions 1*d* at which the folding portions 1*b* of the pressure-sensitive touch sensor 1 are folded. Specifically, it is preferred not to provide the pressure-sensitive adhesive at parts of the fold line portions 1*d* of the pressure-sensitive touch sensor 1 at which no slits 28 are provided. In this manner, the force of the folded folding portion 1*b* trying to return to its original state in the pressure-sensitive touch sensor 1 is weakened.

In this example, a control board 124 including the capacitance detection portion (IC) is fixed on the surface of the frame member 120 on the pressure-sensitive touch sensor 1 side, on the inner side with respect to the four protrusions 122. The control board 124 may be connected to the connection terminal portion 30 of the pressure-sensitive touch sensor 1 via a connector (not shown). Further, the control board 124 has, in addition to the capacitance detection portion (IC), LEDs 126 for letter illumination mounted thereon. The LEDs 126 are configured to illuminate letters through the third electrodes 22 and the operation panel 110 of the pressure-sensitive touch sensor 1 in response to a touch determination state.

In this disclosure, it is preferred that, as described above, the frame member include the protrusions, and the parts of the pressure-sensitive touch sensor at which the elastic layers are positioned be sandwiched between the operation panel and the protrusions of the frame member. In this manner, it becomes easier to compress and deform the elastic layer 26 even at the degree of finger pressing, and the accuracy of detecting the touch operation is further increased.

Examples of the material for forming the frame member include a resin, glass, and inorganic substances.

The resin for forming the frame member may be, for example, the same resin as that given for forming the cover layer. The frame member can be formed through use of only one kind of resin alone, or through use of two or more kinds of resins in combination.

Figure 10:
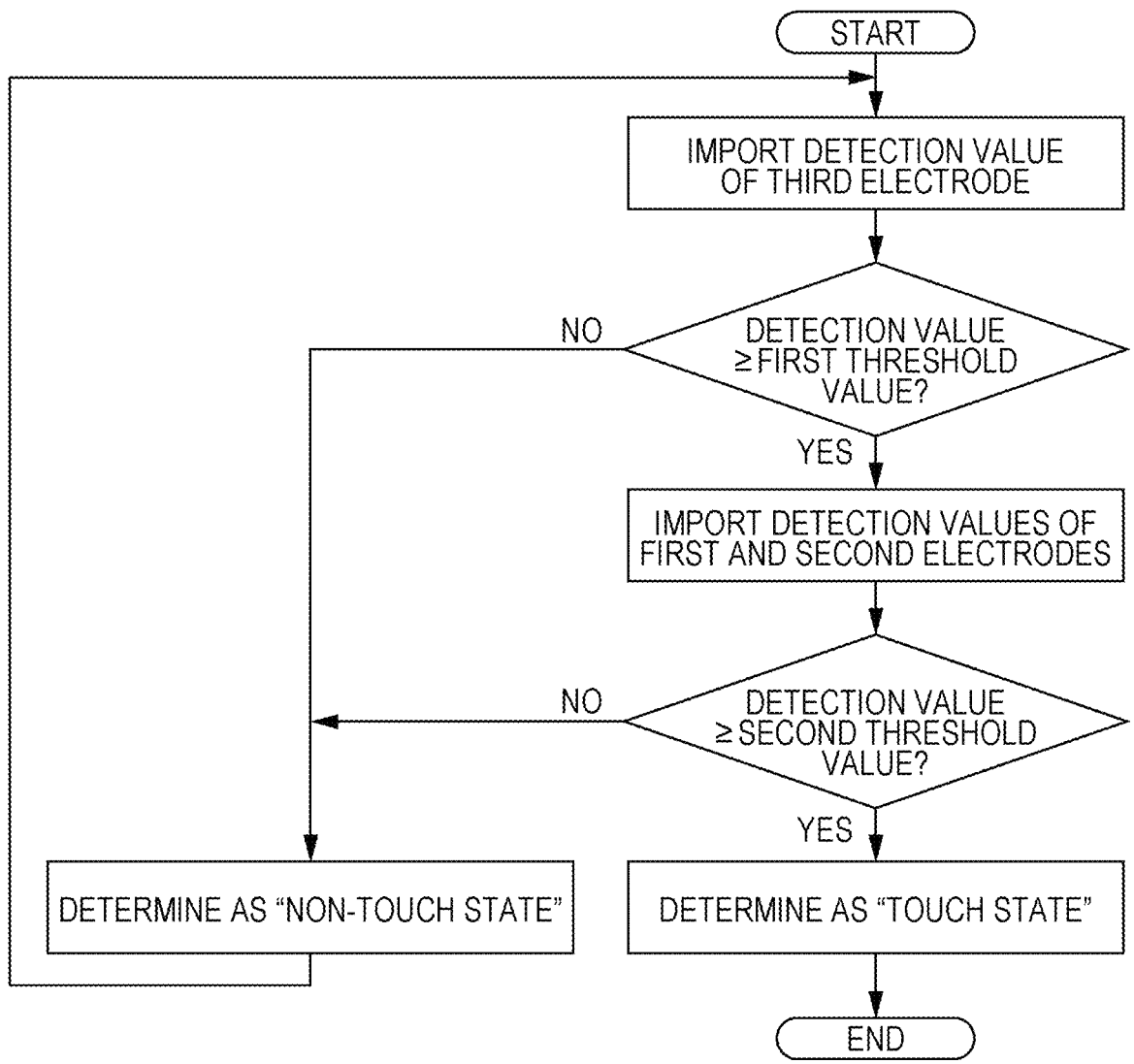
FIG. 10 is a flow chart for illustrating a flow of processing of recognizing a touch onto an operation surface by the pressure-sensitive touch sensor of this disclosure.

Now, processing of determining the touch operation through use of the module 100 is described with reference to FIG. 10.

In the module 100, the four pairs of the first electrodes 18 and the second electrodes 20 of the pressure-sensitive touch sensor 1 are connected to one capacitance detection portion, and the three third electrodes 22 are individually connected to different capacitance detection portions. Further, a first threshold value is set for each detection value detected by the capacitance detection portion connected to each third electrode 22. When a part corresponding to a specific third electrode 22 in the operation surface 112 of the operation panel 110 is touched, the detection value corresponding to the specific third electrode 22 becomes equal to or higher than the first threshold value. Further, a second threshold value is set for a detection value detected by the capacitance detection portion connected to the four pairs of the first electrodes 18 and the second electrodes 20. When the operation surface 112 is pressed with a predetermined pressing force or more, the detection value becomes equal to or higher than the second threshold value.

The four pairs of the first electrodes 18 and the second electrodes 20 may be individually connected to different capacitance detection portions. In this case, the second threshold value can be set for a total value of the detection values detected by the four capacitance detection portions.

Under this state, a part corresponding to one third electrode 22 in the operation surface 112 of the operation panel 110 is pressed by a finger. Then, first, the capacitance changes in this third electrode 22, and the detection value detected by the corresponding capacitance detection portion becomes equal to or higher than the first threshold value. Further, when the elastic layer 26 is compressed and deformed by pressing, and the distances between the four pairs of the first electrodes 18 and the second electrodes 20 are reduced to change the capacitance, the detection value detected by the capacitance detection portion connected to those electrodes becomes equal to or higher than the second threshold value. In this case, it is determined that pressing is performed with an intention of operation, and thus the current state is determined as a touch state.

On the other hand, when a finger only approaches the operation surface 112 of the operation panel 110 without a touch thereto, the detection value detected by the capacitance detection portion corresponding to each third electrode 22 is lower than the first threshold value. Thus, the current state is determined as a non-touch state.

Further, when the part corresponding to one third electrode 22 in the operation surface 112 of the operation panel 110 is only touched, and this part is not pressed, the detection value detected by the capacitance detection portion corresponding to this third electrode 22 becomes equal to or higher than the first threshold value, but the detection value detected by the capacitance detection portion corresponding to the four pairs of the first electrodes 18 and the second electrodes 20 is lower than the second threshold value. Therefore, the current state is determined as the non-touch state when the finger only touches the operation surface without an intention of operation.

Further, when a part not corresponding to the third electrode 22 in the operation surface 112 of the operation panel 110 is pressed, the detection value detected by the capacitance detection portion corresponding to each third electrode 22 is lower than the first threshold value, and the current state is determined as the non-touch state.

As described above, in this disclosure, a slit is formed in the fold line portion for causing the first electrode and the second electrode to face each other, in the base material sheet of the pressure-sensitive touch sensor. In this manner, the force of the folded part of the base material sheet trying to return to its original state is weakened, and the first electrode and the second electrode can maintain a stable distance. Thus, erroneous detection of pressing is suppressed.

Further, in the pressure-sensitive touch sensor of this disclosure, the surface of the first electrode and the surface of the second electrode are caused to face each other by partially folding the base material sheet between the first electrode and the second electrode. Therefore, as compared to the mode in which the folding portion having the second electrode provided thereon is laminated as an individual member, the manufacture is easier, and there is also an advantage in terms of cost.

Further, the pressure-sensitive touch sensor of this disclosure is formed of soft members, and hence has satisfactory followability to curved surfaces and a high adhesive strength to the operation panel. Thus, it becomes easier to suppress mixture of bubbles between the pressure-sensitive touch sensor and the operation panel.

Further, the mode in which the first and second electrodes for detecting pressing and the third electrodes for detecting finger contact are combined with each other, that is, the mode including independent pressure-sensitive electrodes and independent touch electrodes is capable of determining a touch state through use of two levels of threshold values for finger contact and pressure sensing, and thus capable of further suppressing erroneous detection.

The pressure-sensitive touch sensor and the pressure-sensitive touch sensor module of this disclosure are not limited to the above-mentioned pressure-sensitive touch sensor 1.

Figure 11:
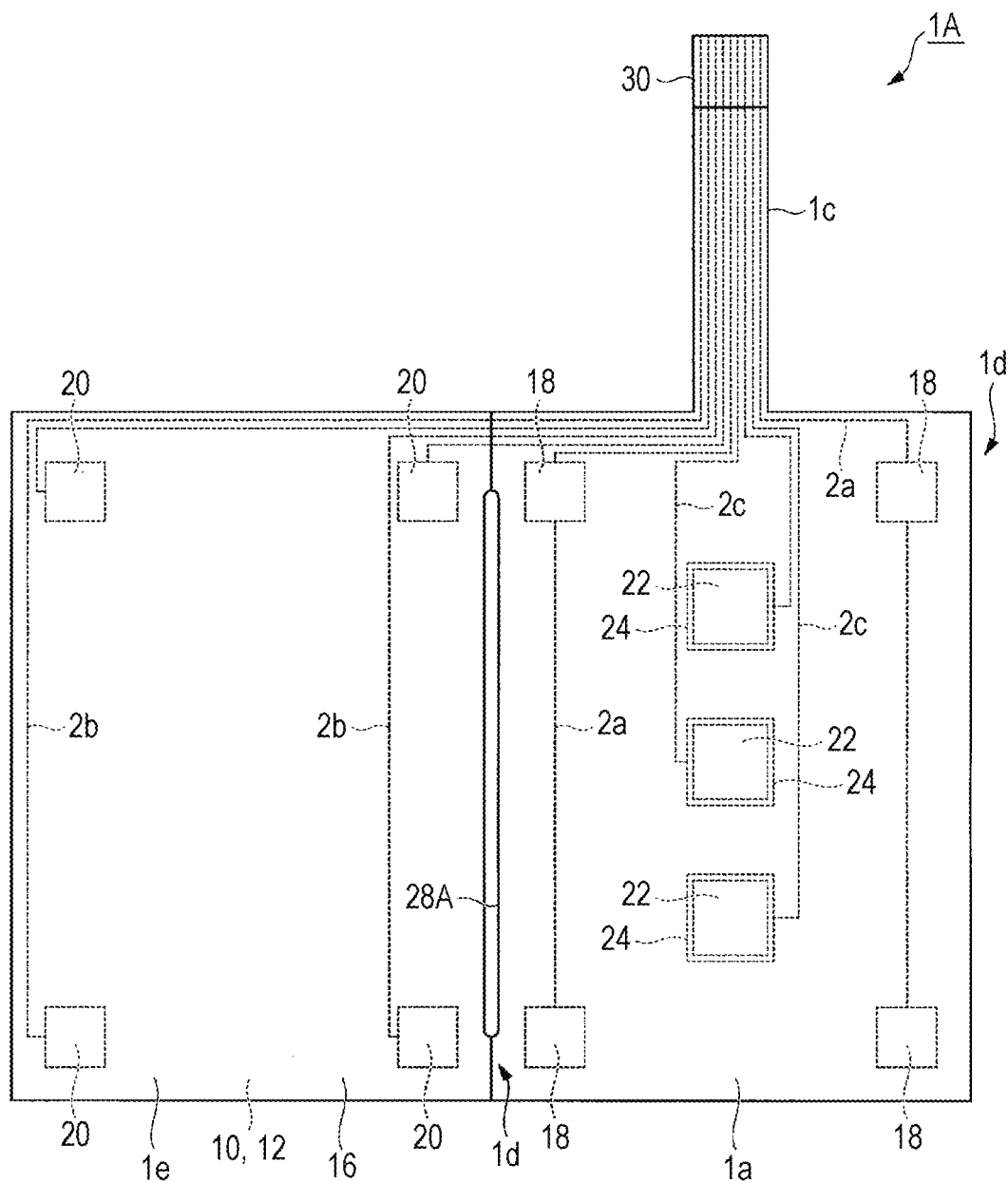
FIG. 11 is a plan view for illustrating a state of another example of the pressure-sensitive touch sensor of this disclosure before a folding portion thereof is folded.
Figure 12:
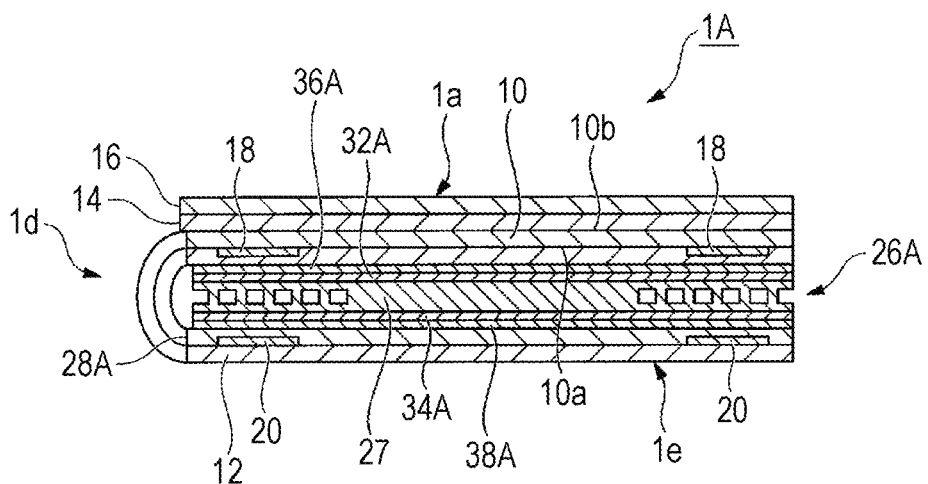
FIG. 12 is a cross-sectional view for illustrating a state in which the folding portion of the pressure-sensitive touch sensor of FIG. 11 is folded.

For example, as illustrated in FIG. 11 and FIG. 12, there may be provided a pressure-sensitive touch sensor 1A, which includes the main body portion 1a and a folding portion 1e having the same rectangular shape, and is to be folded into half between the main body portion 1a and the folding portion 1e. In FIG. 11 and FIG. 12, same parts as those in FIG. 4 and FIG. 2 are denoted by same reference symbols, and description thereof is omitted here. FIG. 12 is a cross-sectional view of a part at which the first electrodes 18 and the second electrodes 20 are positioned under a state in which the folding portion 1e of the pressure-sensitive touch sensor 1A of FIG. 11 is folded and an elastic layer 26A is provided.

In the pressure-sensitive touch sensor 1A, a part at a boundary line between the main body portion 1a and the folding portion 1e corresponds to the fold line portion 1d, and a linear slit 28A is formed along the fold line portion 1d.

Further, in place of the four elastic layers 26, one elastic layer 26A is provided between the main body portion 1a and the folding portion 1e. The elastic layer 26A includes the plurality of column portions 26c at parts corresponding to the first electrodes 18 and the second electrodes 20, and a part of the elastic layer 26A other than the column portions 26c is formed as a solid portion 27 filling the space. With the elastic layer 26A including the solid portion 27, satisfactory light transmittance can be ensured while generation of a level difference is suppressed.

In the pressure-sensitive touch sensor 1, a level difference is generated at a boundary between a part of the main body portion 1a at which the folding portion 1b is present and a part thereof at which the folding portion 1b is absent. However, in the pressure-sensitive touch sensor 1A, such a level difference is not generated under a state in which the folding portion 1e is folded. Therefore, bubbles are less liable to be mixed when the pressure-sensitive touch sensor is bonded to the operation panel, and there is an advantage in that the bonding work is easier. Further, there is also an advantage in that the first electrodes 18 and the second electrodes 20 can be relatively freely arranged.

Meanwhile, in the pressure-sensitive touch sensor 1, as compared to the pressure-sensitive touch sensor 1A, the folding portion of the base material sheet is smaller, and the elastic layer can be formed to have a minimum necessary size, while allows lower cost. Further, a part at which the third electrode is provided (letter illumination portion) has satisfactory light transmittance and excellent letter visibility because no elastic layer is interposed at this part.

Figure 13:
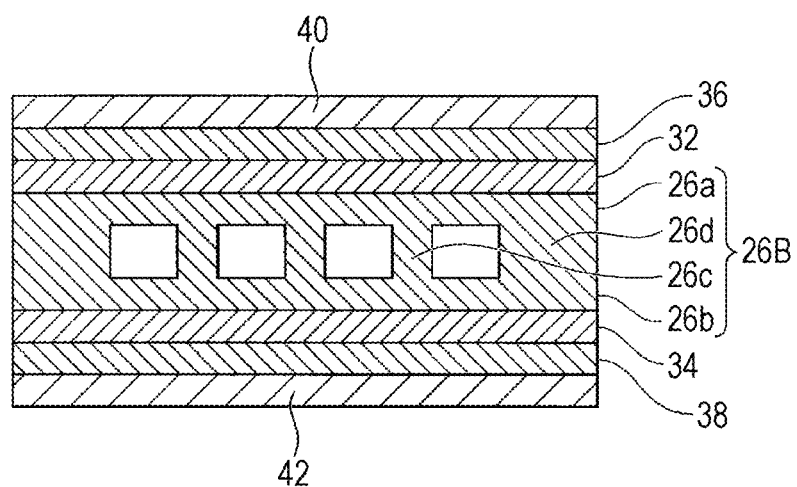
FIG. 13 is a cross-sectional view for illustrating a state of another example of the elastic layer in the pressure-sensitive touch sensor of this disclosure before the elastic layer is provided between the folded parts.

Further, there may be provided a pressure-sensitive touch sensor and a pressure-sensitive touch sensor module including an elastic layer 26B exemplified in FIG. 13 in place of the elastic layer 26. In FIG. 13, same parts as those in FIG. 7 are denoted by same reference symbols, and description thereof is omitted here.

The elastic layer 26B is a rubber-like elastic body including the pair of the first sheet portion 26a and the second sheet portion 26b, the plurality of column portions 26c, and a frame-shaped portion 26d provided to surround all of the plurality of column portions 26c. In the elastic layer 26B, the plurality of column portions 26c and the frame-shaped portion 26d are sandwiched between the pair of the first sheet portion 26a and the second sheet portion 26b.

The force of the folded folding portion 1b trying to return to its original state is larger as the part is closer to the fold line portion 1d. However, when the elastic layer 26B including the frame-shaped portion 26d is used, as compared to the elastic layer 26 not including the frame-shaped portion 26d, a part of the elastic layer 26B closer to the fold line portion 1d is caused to adhere to the base material sheet 10 and the protective layer 12 with a higher adhesion strength. Therefore, the first electrode 18 and the second electrode 20 can maintain a more stable distance, and the accuracy of detecting pressing is further increased. Further, a strength against a shearing force acting on the elastic layer 26B in the planar direction is also increased.

Figure 14:
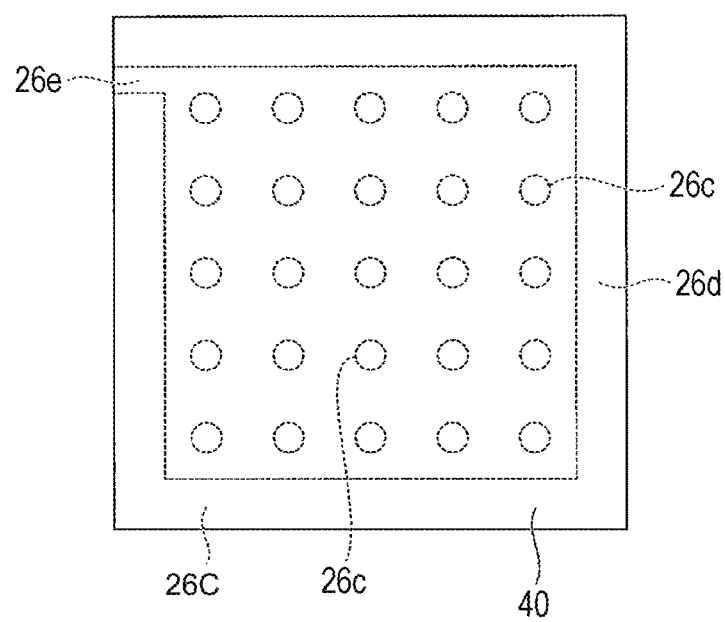
FIG. 14 is a plan view for illustrating a state of another example of the elastic layer in the pressure-sensitive touch sensor of this disclosure before the elastic layer is provided between the folded parts.

Further, as illustrated in FIG. 14, there may be provided a pressure-sensitive touch sensor and a pressure-sensitive touch sensor module including an elastic layer 26C in which, in the elastic layer 26B, a partial cutout portion 26e is formed in the frame-shaped portion 26d. In FIG. 14, same parts as those in FIG. 13 are denoted by same reference symbols, and description thereof is omitted here. In the case of the elastic layer 26C, air present in the frame-shaped portion 26d can be easily released to the outside at the time of compression and deformation, and hence the elastic layer 26C can be more easily compressed and deformed in the thickness direction as compared to the elastic layer 26B.

Figure 15:
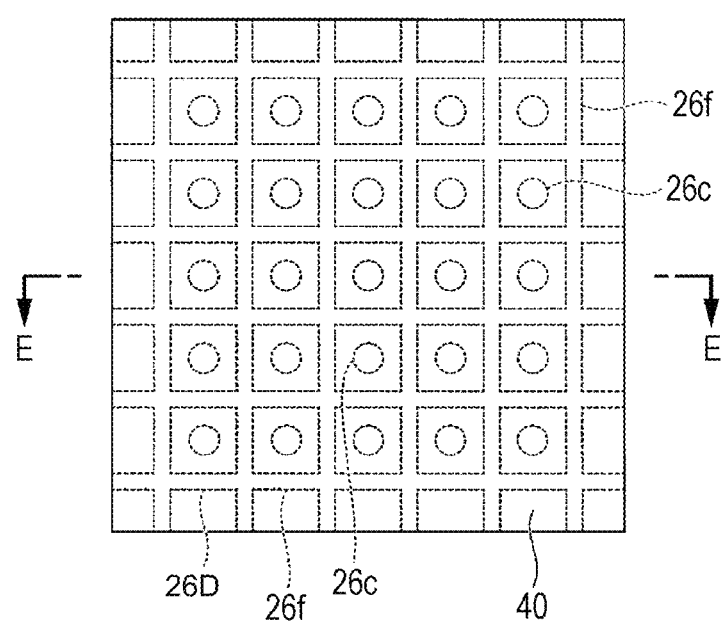
FIG. 15 is a plan view for illustrating a state of another example of the elastic layer in the pressure-sensitive touch sensor of this disclosure before the elastic layer is provided between the folded parts.
Figure 16:
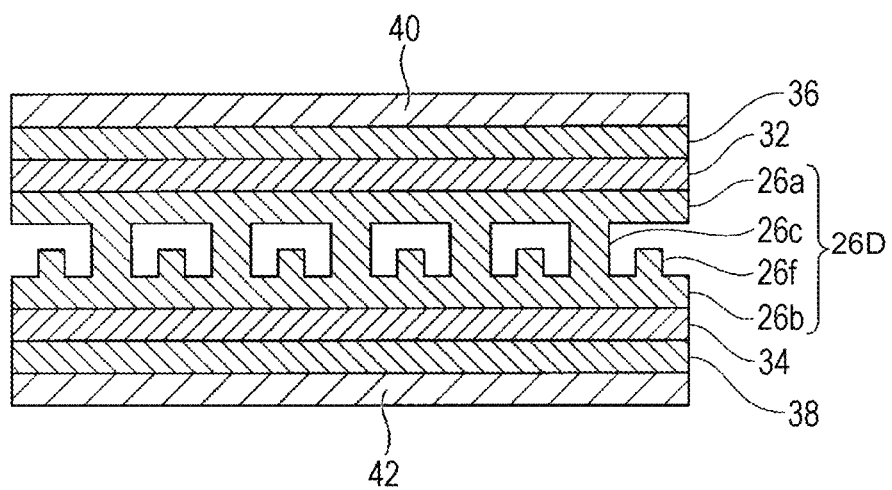
FIG. 16 is an E-E cross-sectional view of the elastic layer of FIG. 15.

Further, as illustrated in FIG. 15 and FIG. 16, there may be provided a pressure-sensitive touch sensor and a pressure-sensitive touch sensor module including an elastic layer 26D in which a plurality of projecting portions 26f projecting from the upper surface of the second sheet portion 26b are provided in a lattice pattern so as to surround the plurality of column portions 26c, respectively. In FIG. 15 and FIG. 16, same parts as those in FIG. 6 and FIG. 7 are denoted by same reference symbols, and description thereof is omitted here.

In the case of the elastic layer 26D, excessive compression and deformation of the elastic layer 26D in the thickness direction can be suppressed by the projecting portions 26f, and thus the pushing depth can be easily controlled. Thus, it becomes easier to reduce the compression set of the elastic layer 26D to be caused by excessive pushing.

The height of the projecting portion 26f is set to be relatively lower with respect to the height of the column portion 26c. When the height of the column portion 26c is 100%, the height of the projecting portion 26f is preferably 80% or less. When the degree to push the operation surface is set large, for example, the height of the projecting portion 26f may be 50% or less, or 30% or less.

From the viewpoint of reducing the compression set of the column portion 26c, the height of the projecting portion 26f is preferably 10% or more, more preferably 20% or more, further preferably 30% or more, and particularly preferably 50% or more, with respect to the height of the column portion 26c being 100%. From the viewpoint of utilizing an initial compression region in which the linearity of the property (compression characteristic) regarding the compression of the column portion 26c is satisfactory, the height of the projecting portion 26f is preferably 30% or more, and more preferably 50% or more, with respect to the height of the column portion 26c being 100%. As the height of the projecting portion 26f becomes larger, the distance between the first electrode and the second electrode can be controlled through use of the initial compression region of the column portion 26c.

The height of the projecting portion 26f can be set, for example, in a range of from 10% to 80%, a range of from 20% to 70%, a range of from 30% to 60%, a range of from 10% to 50%, a range of from 20% to 50%, or a range of from 30% to 50%, with respect to the height of the column portion 26c being 100%.

As a specific example, when the height of the column portion 26c exceeds 200 µm, the column portion 26c is relatively high, and hence the height of the projecting portion 26f is set to, for example, 80% with respect to the height of the column portion 26c (100%). In this case, the movable range (allowable range) by pushing exceeds 40 µm. Sufficient pushing is possible with the movable range exceeding 40 µm.

In this case, the height of the projecting portion 26f does not include the thickness of the second sheet portion 26b. The height of the projecting portion 26f can be measured by an optical microscope measuring machine or other publicly-known fine-structure observing means.

The total area of top surfaces (surfaces on the first sheet portion 26a side) of all projecting portions 26f included in the elastic layer 26D is adjusted as appropriate so that excessive pushing of the column portions 26c can be suppressed. When the area of the first sheet portion 26a or the second sheet portion 26b is 100%, the total area of the top surfaces of all projecting portions 26f is preferably from 1% to 70%, more preferably from 6% to 60%, and further preferably from 8% to 50%. When the above-mentioned percentage is equal to or larger than the lower limit value of the above-mentioned range, in a case in which the operation surface is excessively pushed, the top surfaces of the projecting portions 26f brought into contact with the first sheet portion 26a resist against the pressing force, and any more pushing can be easily suppressed. When the above-mentioned percentage is equal to or smaller than the upper limit value of the above-mentioned range, an installation region of the column portions 26c, which are main components that determine the elastic force of the elastic layer 26D, can be sufficiently secured. Further, it is possible to prevent the contact area between the first sheet portion 26a and the projecting portion 26f from being excessively increased, and thus prevent the first sheet portion 26a and the projecting portion 26f from adsorbing each other at the contact surface. When the first sheet portion 26a and the projecting portions 26f are formed of materials having tackiness, it is important to prevent the above-mentioned adsorption from the viewpoint of smoothly performing repetitive pressing operations.

Specifically, for example, the total area of the top surfaces of all projecting portions 26f may be from 0.1 mm$^2$ to 10 mm$^2$.

In the elastic layer 26D, a ratio of a total area S2 of the top surfaces of all projecting portions 26f to a total area S1 of cross sections of all column portions 26c in a direction perpendicular to the height direction (S2/S1) is preferably 0.1 or more, and more preferably 1 or more. The upper limit value of the ratio of S2/S1 is roughly, for example, about 50. When S2/S1 is equal to or larger than the lower limit value of the above-mentioned range, in a case in which the operation surface is excessively pushed, the top surfaces of the projecting portions 26f brought into contact with the first sheet portion 26a sufficiently resist against the pressing force, and any more pushing can be easily suppressed. When S2/S1 is equal to or smaller than the upper limit value of the above-mentioned range, an installation region of the column portions 26c, which are main components that determine the elastic force of the elastic layer 26D, can be sufficiently secured.

In the elastic layer 26D, the total area S2 is preferred to be larger than the total area S1. With this relationship, excessive pushing can be sufficiently resisted, and the compression set of the column portion 26c can be more easily reduced.

Further, the projecting portions are not limited to have a lattice pattern. For example, the elastic layer may be an elastic layer including an annular projecting portion having a height smaller than the height of the column portion. The projecting portion may be provided along an outer edge of the elastic layer (outer edges of the pair of sheet portions) in plan view on the outer side of the plurality of column portions to surround all of those column portions.

Further, there may be provided an elastic layer in which a plurality of column portions are provided along the outer edge of the elastic layer (outer edges of the pair of sheet portions) in plan view, and one or more protruding portions each having a height smaller than the height of the column portion are provided on the inner side of the plurality of column portions. The preferred modes of the height of the protruding portion and the total area of the top surfaces of the protruding portions on the first sheet portion 26a side are similar to the preferred modes of the projecting portions.

Figure 17:
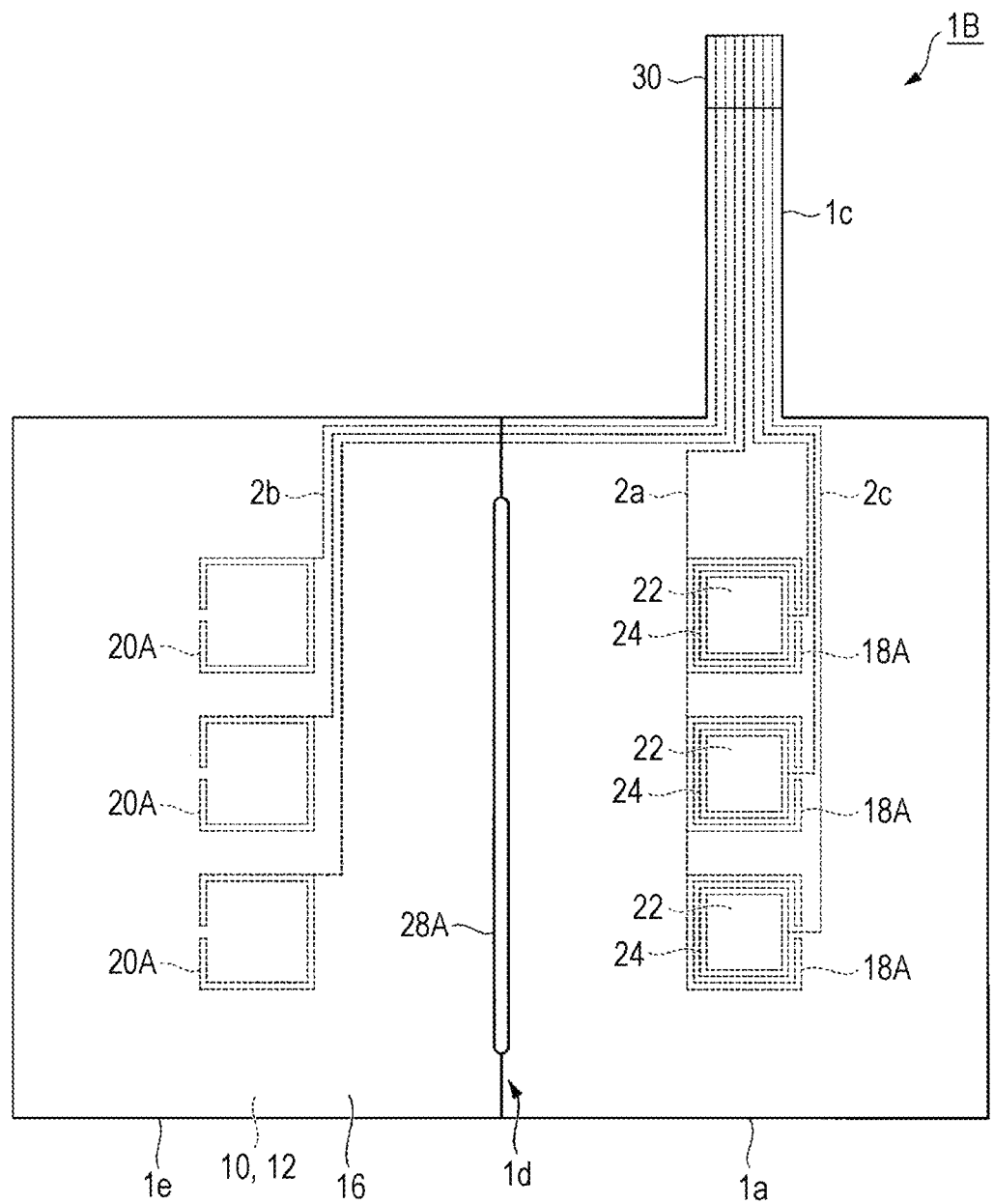
FIG. 17 is a plan view for illustrating a state of another example of the pressure-sensitive touch sensor of this disclosure before a folding portion thereof is folded.

Further, as illustrated in FIG. 17, there may be provided a pressure-sensitive touch sensor 1B in which frame-shaped first electrodes 18A are provided in the main body portion 1a to surround the third electrodes 22 and the auxiliary electrodes 24, and second electrodes 20A having the same shape as the first electrodes 18A are provided at positions corresponding to the first electrodes 18A in the folding portion 1e. In FIG. 17, same parts as those in FIG. 11 are denoted by same reference symbols, and description thereof is omitted here.

Figure 18:
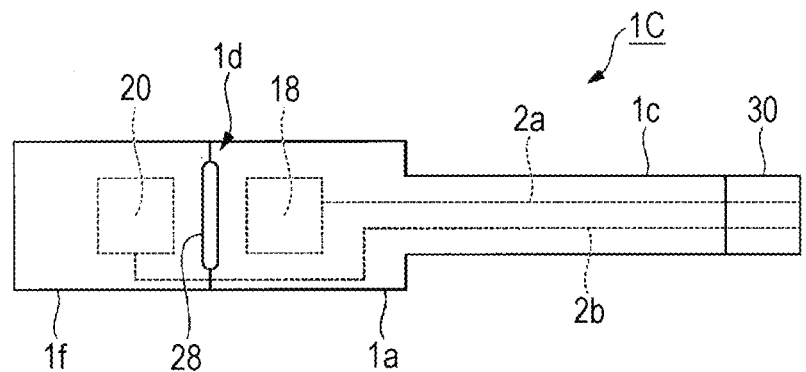
FIG. 18 is a plan view for illustrating a state of another example of the pressure-sensitive touch sensor of this disclosure before a folding portion thereof is folded.

The pressure-sensitive touch sensor of this disclosure is not required to include the third electrodes serving as touch electrodes. For example, as illustrated in FIG. 18, there may be provided a pressure-sensitive touch sensor 1C including the main body portion 1a and a folding portion 1f to be folded into half, and further including the first electrode 18 and the second electrode 20 provided on the main body portion 1a and the folding portion 1f, respectively. The third electrodes 22 and the auxiliary electrodes 24 are not provided. In FIG. 18, same parts as those in FIG. 4 are denoted by same reference symbols, and description thereof is omitted here.

The positions of the first electrode and the second electrode in the pressure-sensitive touch sensor of this disclosure are not limited to the positions in the pressure-sensitive touch sensors 1 and 1A to 1C, and can be set as appropriate. The positions of the third electrodes in the pressure-sensitive touch sensor of this disclosure are also not limited to the positions in the pressure-sensitive touch sensors 1, 1A, and 1B, and can be set as appropriate.

The mode of the slit in the pressure-sensitive touch sensor of this disclosure is not limited to the slits 28 and 28A described above. The slit may be formed at a part other than the part between the first electrode and the second electrode of the base material sheet, in the fold line portion of the pressure-sensitive touch sensor.

For example, there may be provided pressure-sensitive touch sensors 1D to 1G exemplified in FIG. 19 to FIG. 22. In FIG. 19 to FIG. 22, same parts as those in FIG. 18 are denoted by same reference symbols, and description thereof is omitted here.

Figure 19:
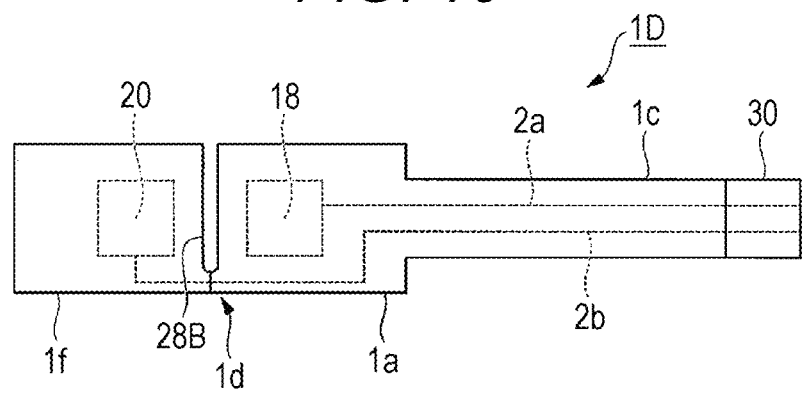
FIG. 19 is a plan view for illustrating a state of another example of the pressure-sensitive touch sensor of this disclosure before a folding portion thereof is folded.

In the pressure-sensitive touch sensor 1D, as illustrated in FIG. 19, a slit 28B is formed to extend from one end portion toward another end portion of the fold line portion 1*d* for the main body portion 1*a* and the folding portion 1*f*, and the main body portion 1*a* and the folding portion 1*f* are connected to each other at an end portion of the fold line portion 1*d* on one side.

Figure 20:
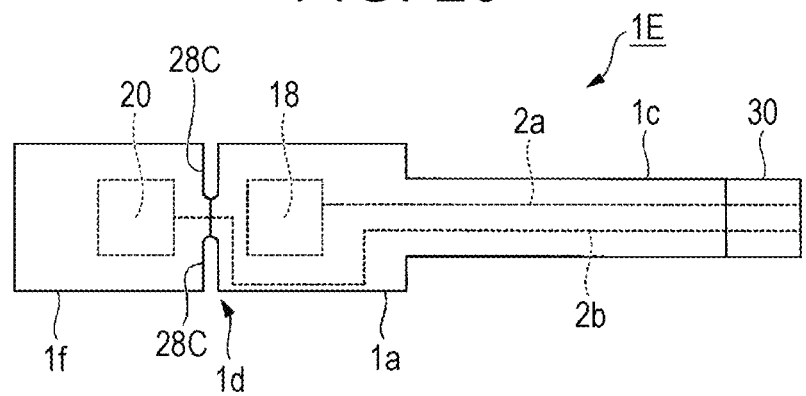
FIG. 20 is a plan view for illustrating a state of another example of the pressure-sensitive touch sensor of this disclosure before a folding portion thereof is folded.

In the pressure-sensitive touch sensor 1E, as illustrated in FIG. 20, slits 28C are formed to extend toward the center from end portions on both sides of the fold line portion 1*d* for the main body portion 1*a* and the folding portion 1*f*, and the main body portion 1*a* and the folding portion 1*f* are connected to each other at a center portion of the fold line portion 1*d*.

Figure 21:
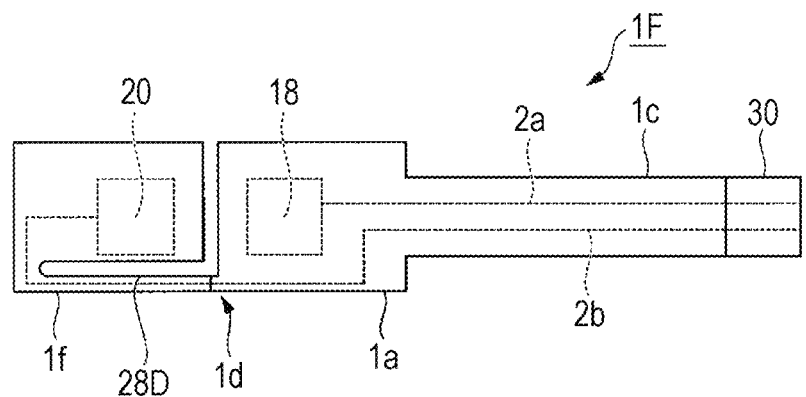
FIG. 21 is a plan view for illustrating a state of another example of the pressure-sensitive touch sensor of this disclosure before a folding portion thereof is folded.

In the pressure-sensitive touch sensor 1F, as illustrated in FIG. 21, a slit 28D is formed to extend from one end portion toward another end portion of the fold line portion 1*d* for the main body portion 1*a* and the folding portion 1*f*, and further to extend after bending at a right angle toward the folding portion 1*f* side. The main body portion 1*a* and the folding portion 1*f* are connected to each other at an end portion of the fold line portion 1*d* on one side.

Figure 22:
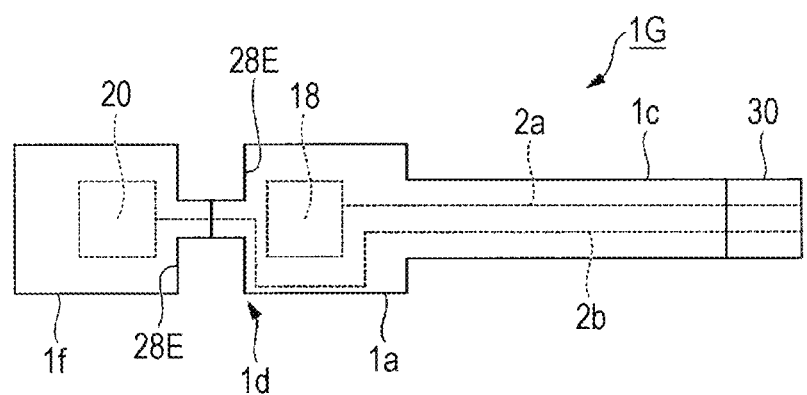
FIG. 22 is a plan view for illustrating a state of another example of the pressure-sensitive touch sensor of this disclosure before a folding portion thereof is folded.

In the pressure-sensitive touch sensor 1G, as illustrated in FIG. 22, slits 28E each having a width wider than that of the slit 28C are formed to extend toward the center from end portions on both sides of the fold line portion 1*d* for the main body portion 1*a* and the folding portion 1*f*. The main body portion 1*a* and the folding portion 1*f* are connected to each other at a center portion of the fold line portion 1*d*.

The mode in which the main body portion 1*a* and the folding portion 1*f* are connected to each other at the end portions of the fold line portion 1*d* on both sides as in the pressure-sensitive touch sensor 1C has an advantage in that, as compared to the mode in which the main body portion 1*a* and the folding portion 1*f* are connected to each other at the center portion of the fold line portion 1*d* or at the end portion of the fold line portion 1*d* on one side as in the pressure-sensitive touch sensors 1D to 1G, misalignment is less liable to be caused when the folding portion 1*f* is folded and bonded.

In the mode in which the main body portion 1*a* and the folding portion 1*f* are connected to each other at the end portion of the fold line portion 1*d* on one side as in the pressure-sensitive touch sensor 1D, unlike the mode in which the main body portion 1*a* and the folding portion 1*f* are connected to each other at the center portion of the fold line portion 1*d* as in the pressure-sensitive touch sensor 1E, the wiring line 2*b* is not arranged between the first electrode 18 and the second electrode 20. In this manner, the force of the folded folding portion 1*f* trying to return to its original state is less liable to affect the first electrode 18 and the second electrode 20. Therefore, the mode as the pressure-sensitive touch sensor 1D is preferred to the mode as the pressure-sensitive touch sensor 1E because the first electrode 18 and the second electrode 20 can maintain a more stable distance, and the detection accuracy is higher.

In the mode as the pressure-sensitive touch sensor 1F, a rectangular part of the folding portion 1*f* at which the second electrode 20 is provided and the end portion of the fold line portion 1*d* on one side at which the main body portion 1*a* and the folding portion 1*f* are connected are connected through intermediation of a part having an elongated band shape. In this manner, the force of the folded folding portion 1*f* trying to return to its original state is less liable to affect the second electrode 20. Therefore, the mode as the pressure-sensitive touch sensor 1F is preferred to the mode as the pressure-sensitive touch sensor 1D because the first electrode 18 and the second electrode 20 can maintain a more stable distance, and the detection accuracy is higher. From the viewpoint that the wiring line can be shortened, the mode as the pressure-sensitive touch sensor 1D is preferred to the mode as the pressure-sensitive touch sensor 1F.

In the mode as the pressure-sensitive touch sensor 1G, a long distance can be secured between the first electrode 18 and the fold line portion 1*d* and between the second electrode 20 and the fold line portion 1*d*, and hence the force of the folded folding portion 1*f* trying to return to its original state is less liable to affect the first electrode 18 and the second electrode 20. Therefore, this mode is preferred because the first electrode 18 and the second electrode 20 can maintain a more stable distance, and the detection accuracy is higher. Meanwhile, from the viewpoint of easiness of reducing the product size, the modes as the pressure-sensitive touch sensors 1C to 1F are preferred to the mode as the pressure-sensitive touch sensor 1G.

When the pressure-sensitive touch sensors 1C to 1G are compared to each other, the pressure-sensitive touch sensors 1C and 1D are preferred to the pressure-sensitive touch sensors 1E to 1G, and the pressure-sensitive touch sensor 1C is particularly preferred.

The pressure-sensitive touch sensor of this disclosure is not limited to the mode in which the first electrode and the second electrode are provided on the same surface of the base material sheet, and the base material sheet is folded so that the surface on which the first electrode and the second electrode are provided is located on the inner side. For example, there may be provided a pressure-sensitive touch sensor in which the first electrode and the second electrode are provided on the same surface of the base material sheet, and the base material sheet is folded so that the surface on which the first electrode and the second electrode are provided is located on the outer side, thereby causing the surface of the first electrode and the surface of the second electrode to face each other.

Further, in the pressure-sensitive touch sensor of this disclosure, the first electrode and the second electrode may be provided on different surfaces of the base material sheet. For example, there may be provided a pressure-sensitive touch sensor in which the first electrode is provided on the first surface of the base material sheet, the second electrode is provided on the second surface thereof, and the base material sheet is folded so that the surface of the first electrode and the surface of the second electrode are caused to face each other.

As compared to the mode in which the first electrode and the second electrode are provided on different surfaces of the base material sheet, the mode in which the first electrode and the second electrode are provided on the same surface of the base material sheet has advantages in that the number of manufacturing steps can be reduced, and the cost is lower. Further, from the viewpoint that the distance between the first electrode and the second electrode can be further reduced and a higher sensitivity can be achieved, it is particularly preferred to employ the mode in which the first electrode and the second electrode are provided on the same surface of the base material sheet, and the base material sheet is folded so that the surface on which the first electrode and the second electrode are provided is located on the inner side, thereby causing the surface of the first electrode and the surface of the second electrode to face each other.

The invention claimed is:
1. A pressure-sensitive touch sensor of a capacitance type, which is configured to detect pressing on an operation surface, the pressure-sensitive touch sensor comprising:
a base material sheet;
a first electrode;
a second electrode; and
an elastic layer,
wherein the first electrode and the second electrode are each provided on any surface of the base material sheet,
wherein the base material sheet is folded between the first electrode and the second electrode so that a surface of the first electrode and a surface of the second electrode face each other,
wherein the base material sheet is folded at a fold line portion in which a slit is formed,
wherein the elastic layer is provided between folded parts of the base material sheet, wherein the elastic layer is a rubber-like elastic body including:
a pair of sheet portions;
a plurality of column portions sandwiched between the pair of sheet portions; and
a frame-shaped portion provided to surround the plurality of column portions, and wherein the pressing on the operation surface is detected based on a change in capacitance, which is caused when the elastic layer is compressed and deformed in a thickness direction by a pressing force to reduce a distance between the first electrode and the second electrode.

2. A pressure-sensitive touch sensor of a capacitance type, which is configured to detect pressing on an operation surface, the pressure-sensitive touch sensor comprising:
a base material sheet;
a first electrode;
a second electrode; and
an elastic layer,
wherein the first electrode and the second electrode are each provided on any surface of the base material sheet,
wherein the base material sheet is folded between the first electrode and the second electrode so that a surface of the first electrode and a surface of the second electrode face each other,
wherein the base material sheet is folded at a fold line portion in which a slit is formed,
wherein the elastic layer is provided between folded parts of the base material sheet, wherein the elastic layer is a rubber-like elastic body including:
a pair of sheet portions;
a plurality of column portions sandwiched between the pair of sheet portions; and
a projecting portion or a protruding portion, which is sandwiched between the pair of sheet portions, and has a height smaller than a height of each of the plurality of column portions, and
wherein the pressing on the operation surface is detected based on a change in capacitance, which is caused when the elastic layer is compressed and deformed in a thickness direction by a pressing force to reduce a distance between the first electrode and the second electrode.

3. A pressure-sensitive touch sensor of a capacitance type, which is configured to detect pressing on an operation surface, the pressure-sensitive touch sensor comprising:
a base material sheet;
a first electrode;
a second electrode; and
an elastic layer,
wherein the first electrode and the second electrode are each provided on any surface of the base material sheet,
wherein the base material sheet is folded between the first electrode and the second electrode so that a surface of the first electrode and a surface of the second electrode face each other,
wherein the base material sheet is folded at a fold line portion in which a slit is formed,
wherein the elastic layer is provided between folded parts of the base material sheet, wherein the elastic layer is a rubber-like elastic body including:
a pair of sheet portions;
a plurality of column portions sandwiched between the pair of sheet portions; and
projecting portions, which are sandwiched between the pair of sheet portions, and are provided in a lattice pattern so as to individually surround the plurality of column portions, and wherein the pressing on the operation surface is detected based on a change in capacitance, which is caused when the elastic layer is compressed and deformed in a thickness direction by a pressing force to reduce a distance between the first electrode and the second electrode.

4. A pressure-sensitive touch sensor of a capacitance type, which is configured to detect pressing on an operation surface, the pressure-sensitive touch sensor comprising:
a base material sheet;
a first electrode;
a second electrode; and
an elastic layer,
wherein the first electrode and the second electrode are each provided on any surface of the base material sheet,
wherein the base material sheet is folded between the first electrode and the second electrode so that a surface of the first electrode and a surface of the second electrode face each other,
wherein the base material sheet is folded at a fold line portion in which a slit is formed,
wherein the elastic layer is provided between folded parts of the base material sheet, wherein the elastic layer is a rubber-like elastic body including:
a pair of sheet portions; and
a column portion sandwiched between the pair of sheet portions, and
wherein the pressing on the operation surface is detected based on a change in capacitance, which is caused when the elastic layer is compressed and deformed in a thickness direction by a pressing force to reduce a distance between the first electrode and the second electrode.

5. The pressure-sensitive touch sensor according to claim 4, further comprising a third electrode provided on a first surface of the base material sheet,
wherein the pressure-sensitive touch sensor is configured to detect a contact of a conductor onto the operation surface based on a change in capacitance of the third electrode, which is caused when the conductor is brought into contact with the operation surface.

6. A pressure-sensitive touch sensor module, comprising:
an operation panel having an operation surface;
a frame member; and
the pressure-sensitive touch sensor of any one of claims 4 to 5,
wherein the pressure-sensitive touch sensor is sandwiched between the operation panel and the frame member.

7. The pressure-sensitive touch sensor module according to claim 6,
  wherein the frame member includes a protrusion, and
  wherein a part of the pressure-sensitive touch sensor at which the elastic layer is positioned is sandwiched between the operation panel and the protrusion.

\* \* \* \* \*